(12) United States Patent
Sugiyama

(10) Patent No.: US 11,175,571 B2
(45) Date of Patent: Nov. 16, 2021

(54) PROJECTOR

(71) Applicant: SEIKO EPSON CORPORATION, Tokyo (JP)

(72) Inventor: Nobuo Sugiyama, Azumino (JP)

(73) Assignee: SEIKO EPSON CORPORATION, Tokyo (JP)

(*) Notice: Subject to any disclaimer, the term of this patent is extended or adjusted under 35 U.S.C. 154(b) by 1 day.

(21) Appl. No.: 16/924,435

(22) Filed: Jul. 9, 2020

(65) Prior Publication Data
US 2021/0011361 A1 Jan. 14, 2021

(30) Foreign Application Priority Data
Jul. 10, 2019 (JP) .............................. JP2019-128578

(51) Int. Cl.
| | |
|---|---|
| *G03B 21/16* | (2006.01) |
| *H05K 7/20* | (2006.01) |
| *F28D 21/00* | (2006.01) |
| *H04N 5/74* | (2006.01) |
| *H04N 9/31* | (2006.01) |

(52) U.S. Cl.
CPC ......... *G03B 21/16* (2013.01); *F28D 21/0015* (2013.01); *H04N 5/74* (2013.01); *H04N 9/3144* (2013.01); *H05K 7/20* (2013.01); *F28D 2021/0028* (2013.01)

(58) Field of Classification Search
None
See application file for complete search history.

(56) References Cited

U.S. PATENT DOCUMENTS

| | | |
|---|---|---|
| 8,517,540 B2 | 8/2013 | Terao |
| 2002/0191159 A1 | 12/2002 | Nagao et al. |
| 2009/0086169 A1 | 4/2009 | Nakamura |
| 2010/0132379 A1 | 6/2010 | Wu et al. |
| 2011/0234984 A1 | 9/2011 | Egawa et al. |
| 2011/0242499 A1 | 10/2011 | Terao |

(Continued)

FOREIGN PATENT DOCUMENTS

| | | |
|---|---|---|
| JP | H11-057383 A | 3/1999 |
| JP | H11-169644 A | 6/1999 |
| JP | 2002-107698 A | 4/2002 |

(Continued)

*Primary Examiner* — Michelle M Iacoletti
*Assistant Examiner* — Danell L Owens
(74) *Attorney, Agent, or Firm* — Oliff PLC

(57) ABSTRACT

A projector having a cooling target includes a light source configured to emit light, a light modulator configured to modulate the light emitted from the light source, a projection optical device, a cooler configured to cool the cooling target based on transformation of a refrigerant into a gas, and a dust-proof case configured to house at least a part of the cooling target inside. The cooler includes a refrigerant generator configured to generate the refrigerant, and a refrigerant sender configured to transmit the generated refrigerant toward the cooling target. The cooling target includes a cooling target main body part, and a cooling target part which is thermally coupled to the cooling target main body part, and to which the refrigerant is transmitted from the refrigerant sender. The cooling target main body part is disposed inside the dust-proof case. The cooling target part is disposed outside the dust-proof case.

11 Claims, 11 Drawing Sheets

(56) References Cited

U.S. PATENT DOCUMENTS

2019/0196311 A1    6/2019  Sugiyama et al.

FOREIGN PATENT DOCUMENTS

| | | | | |
|---|---|---|---|---|
| JP | 2002-326012 | A | 11/2002 | |
| JP | 2002-372748 | A | 12/2002 | |
| JP | 2004-109731 | A | 4/2004 | |
| JP | 2005-121250 | A | 5/2005 | |
| JP | 2007-240646 | A | 9/2007 | |
| JP | 2007-294655 | A | 11/2007 | |
| JP | 2008-197344 | A | 8/2008 | |
| JP | 2008197344 | A * | 8/2008 | ......... F28D 15/0233 |
| JP | 2009-086271 | A | 4/2009 | |
| JP | 2010-107751 | A | 5/2010 | |
| JP | 2011-036768 | A | 2/2011 | |
| JP | 2011-215457 | A | 10/2011 | |
| JP | 2014-059573 | A | 4/2014 | |
| JP | 2014-087797 | A | 5/2014 | |
| JP | 2018-097312 | A | 6/2018 | |
| JP | 2019-117332 | A | 7/2019 | |

* cited by examiner

PROJECTOR

The present application is based on, and claims priority from JP Application Serial Number 2019-128578, filed Jul. 10, 2019, the disclosure of which is hereby incorporated by reference herein in its entirety.

BACKGROUND

1. Technical Field

The present disclosure relates to a projector.

2. Related Art

As a device for cooling a projector, there are proposed such a cooler due to air cooling using a blower as described in, for example, JP-A-2002-107698, such a cooler due to liquid cooling using a pump for feeding a refrigerant liquid and a pipe for transmitting the refrigerant liquid as described in, for example, JP-A-2007-294655, and so on.

In recent years, due to an increase in luminance of projectors, an amount of heat of a cooling target to be cooled by a cooler has increased, and an improvement in cooling performance of the cooler is required. However, when improving the cooling performance in the cooler described above using air cooling, liquid cooling, and so on, there is a problem that the cooler grows in size, and thus the projector grows in size. Further, in the case of air cooling, there is also a problem that the sound noise due to the blower increases.

SUMMARY

A projector according to an aspect of the present disclosure is a projector having a cooling target, including a light source configured to emit light, a light modulator configured to modulate the light emitted from the light source, a projection optical device configured to project the light modulated by the light modulator, a cooler configured to cool the cooling target based on transformation of a refrigerant into a gas, and a dust-proof case configured to house at least a part of the cooling target inside. The cooler includes a refrigerant generator configured to generate the refrigerant, and a refrigerant sender configured to transmit the generated refrigerant toward the cooling target. The cooling target includes a cooling target main body part, and a cooling target part which is thermally coupled to the cooling target main body part, and to which the refrigerant is transmitted from the refrigerant sender. The cooling target main body part is disposed inside the dust-proof case, and the cooling target part is disposed outside the dust-proof case.

The projector may be configured such that the projector further includes a light modulation unit including the light modulator and a holding frame configured to hold the light modulator. The holding frame includes a frame main body part configured to hold the light modulator, and an extending part extending from the frame main body part. The light modulation unit corresponds to the cooling target, the light modulator corresponds to the cooling target main body part, and the extending part corresponds to the cooling target part.

The projector may be configured such that the dust-proof case has a through hole through which the holding frame is inserted, and a sealing member is disposed between the through hole and the holding frame.

The projector may be configured such that the cooler includes a cooling blower configured to deliver air to the cooling target part.

The projector may be configured such that the projector further includes a duct through which the air delivered from the cooling blower flows, and a plurality of cooling targets including the cooling target. The respective cooling target parts in the plurality of cooling targets are disposed inside the duct.

The projector may be configured such that the respective cooling target parts in the plurality of cooling targets are arranged along a flow direction of the air flowing inside the duct.

The projector may be configured such that the duct includes a plurality of branch paths to which the air delivered from the cooling blower branches. At least one of the cooling target parts is disposed in each of the branch paths.

The projector may be configured such that the projector further includes a circulation blower disposed inside the dust-proof case and configured to circulate the air inside the dust-proof case.

The projector may be configured such that the dust-proof case has a heat dissipation structure configured to release heat outside the dust-proof case.

The projector may be configured such that the heat dissipation structure includes a plurality of inner fins disposed on an inner side surface of the dust-proof case.

The projector may be configured such that the heat dissipation structure includes a plurality of outer fins disposed on an outer side surface of the dust-proof case.

DESCRIPTION OF EXEMPLARY EMBODIMENTS

A projector according to an embodiment of the present disclosure will hereinafter be described with reference to the drawings. It should be noted that the scope of the present disclosure is not limited to the embodiments hereinafter described, but can arbitrarily be modified within the technical idea or the technical concept of the present disclosure. Further, in the following drawings, in order to make each constituent easy to understand, each of the structures is made different from the actual structure in scale size, number, and so on in some cases.

First Embodiment

Figure 1:
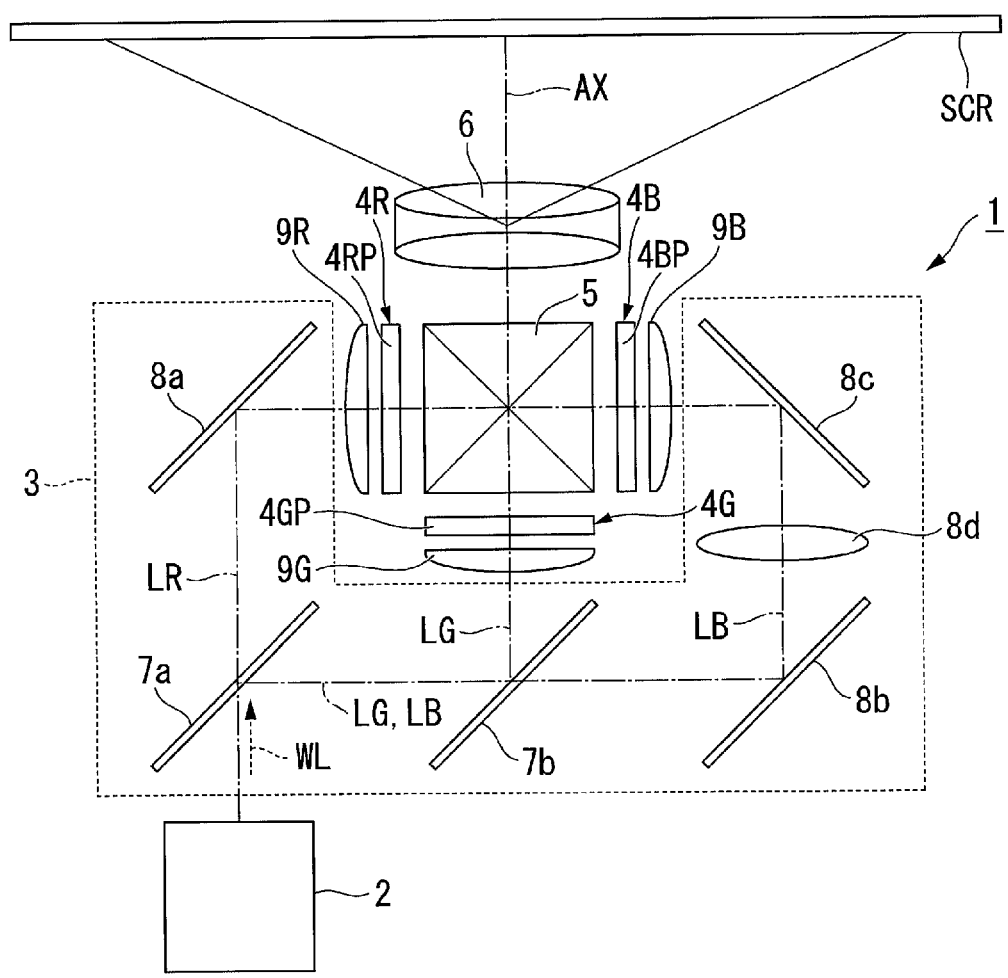
FIG. 1 is a schematic configuration diagram showing a projector according to a first embodiment.
Figure 2:
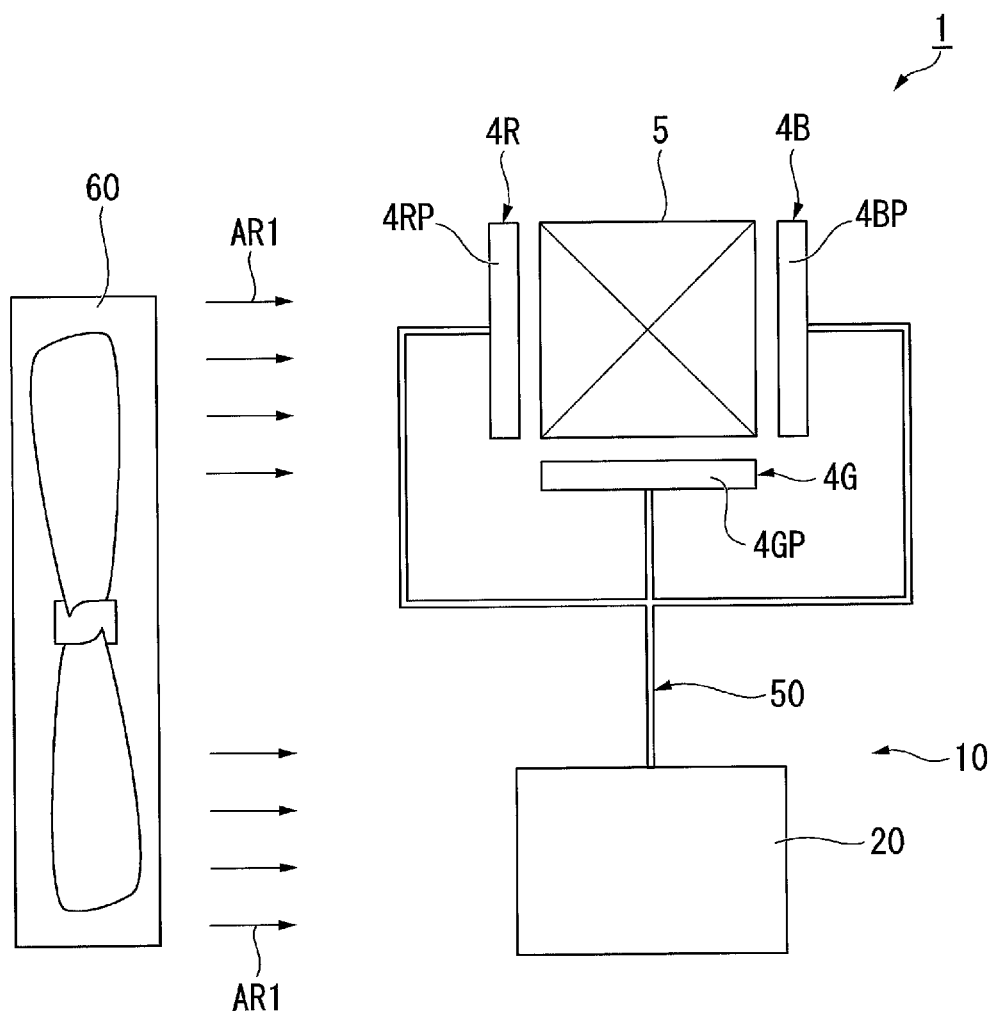
FIG. 2 is a schematic diagram showing a part of the projector according to the first embodiment.

FIG. 1 is a schematic configuration diagram showing the projector 1 according to the present embodiment. FIG. 2 is a schematic diagram showing a part of the projector 1 according to the present embodiment. As shown in FIG. 1, the projector 1 is provided with a light source device 2, a color separation optical system 3, a light modulation unit 4R, alight modulation unit 4G, a light modulation unit 4B, a light combining optical system 5, and a projection optical device 6. The light modulation unit 4R has a light modulator 4RP. The light modulation unit 4G has a light modulator 4GP. The light modulation unit 4B has a light modulator 4BP.

The light source device 2 emits illumination light WL regulated so as to have a substantially homogenous illuminance distribution toward the color separation optical system 3. The light source device 2 has, for example, a semiconductor laser as a light source. The color separation optical system 3 separates the illumination light WL from the light source device 2 into red light LR, green light LG, and blue light LB. The color separation optical system 3 is provided with a first dichroic mirror 7a, a second dichroic mirror 7b, a first reflecting mirror 8a, a second reflecting mirror 8b, a third reflecting mirror 8c, and a relay lens 8d.

The first dichroic mirror 7a separates the illumination light WL having been emitted from the light source device 2 into the red light LR, and the light including the green light LG and the blue light LB mixed with each other. The first dichroic mirror 7a has a property of transmitting the red light LR, while reflecting the green light LG and the blue light LB. The second dichroic mirror 7b separates the light including the green light LG and the blue light LB mixed with each other into the green light LG and the blue light LB. The second dichroic mirror 7b has a property of reflecting the green light LG, while transmitting the blue light LB.

The first reflecting mirror 8a is disposed in the light path of the red light LR, and the red light LR having been transmitted through the first dichroic mirror 7a is reflected by the first reflecting mirror 8a toward the light modulator 4RP. The second reflecting mirror 8b and the third reflecting mirror 8c are disposed in the light path of the blue light LB, and the blue light LB having been transmitted through the second dichroic mirror 7b is guided by the second reflecting mirror 8b and the third reflecting mirror 8c to the light modulator 4BP.

The light modulator 4RP, the light modulator 4GP, and the light modulator 4BP are each formed of a liquid crystal panel. The light modulator 4RP modulates the red light LR out of the light emitted from the light source device 2 in accordance with an image signal. The light modulator 4GP modulates the green light LG out of the light emitted from the light source device 2 in accordance with an image signal. The light modulator 4BP modulates the red light LB out of the light emitted from the light source device 2 in accordance with an image signal. Thus, the light modulators 4RP, 4GP, and 4BP each form image light corresponding to the colored light. Although not shown in the drawings, on the light incident side and the light exit side of each of the light modulators 4RP, 4GP, and 4BP, there are respectively disposed polarization plates.

On the light incident side of the light modulator 4RP, there is disposed a field lens 9R for collimating the red light LR entering the light modulator 4RP. On the light incident side of the light modulator 4GP, there is disposed a field lens 9G for collimating the green light LG entering the light modulator 4GP. On the light incident side of the light modulator 4BP, there is disposed a field lens 9B for collimating the blue light LB entering the light modulator 4BP.

The color combining optical system 5 is formed of a cross dichroic prism having a substantially cubic shape. The light combining optical system 5 combines the image light of the respective colors from the light modulators 4RP, 4GP, and 4BP with each other. The light combining optical system 5 emits the image light thus combined toward the projection optical device 6. The projection optical device 6 is formed of a projection lens group. The projection optical device 6 projects the image light combined by the light combining optical system 5, namely the light modulated by the light modulators 4RP, 4GP, and 4BP, toward a screen SCR in an enlarged manner. Thus, a color image (picture) thus enlarged is displayed on the screen SCR.

As shown in FIG. 2, the projector 1 is further provided with a cooler 10. The cooler 10 cools a cooling target provided to the projector 1 by a refrigerant W changing to a gas. In the present embodiment, the refrigerant W is, for example, water as a fluid. Therefore, in the following description, the change of the refrigerant W to the gas is simply referred to as evaporation in some cases. In the present embodiment, the cooling target includes the light modulation units 4R, 4G, and 4B. In other words, in the present embodiment, the cooling target includes the light modulators 4RP, 4GP, and 4BP. In the present embodiment, the light modulators 4RP, 4GP, and 4BP correspond to a cooling target main body part.

The cooler 10 has a refrigerant generator 20 and a refrigerant sender 50. The refrigerant generator 20 is a section for generating the refrigerant W. The refrigerant sender 50 is a section for transmitting the refrigerant W thus generated toward the cooling target. Due to the evaporation of the refrigerant W having been transmitted by the refrigerant sender 50 to the cooling target, namely the light modulation units 4R, 4G, and 4B in the present embodiment, it is possible to draw the heat from the cooling target, and thus, it is possible for the cooler 10 to cool the cooling target. Each of the sections will hereinafter be described in detail.

Figure 3:
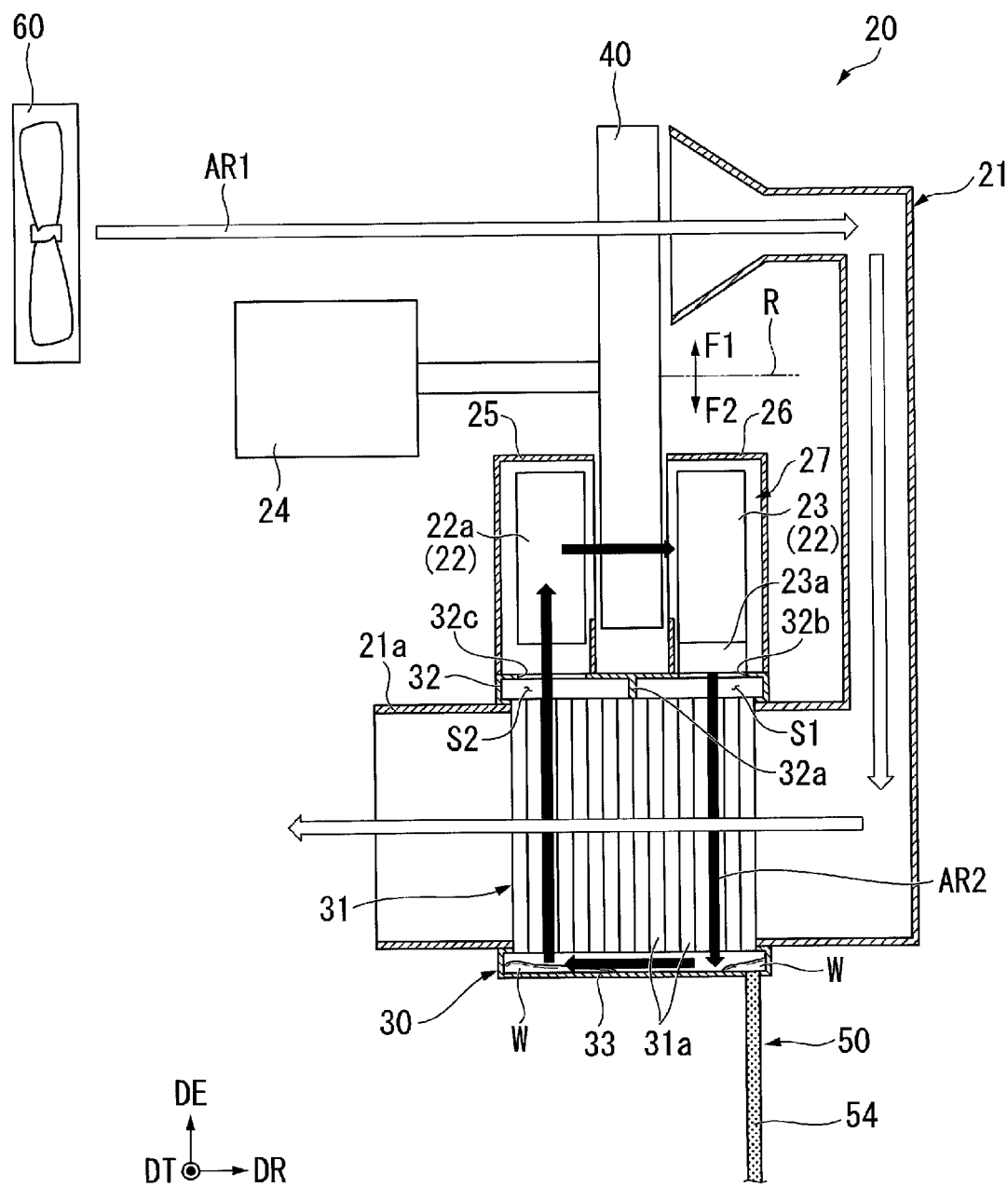
FIG. 3 is a schematic configuration diagram schematically showing a refrigerant generator in the first embodiment.

FIG. 3 is a schematic configuration diagram schematically showing a refrigerant generator 20 in the present embodiment. As shown in FIG. 3, the refrigerant generator 20 has a moisture absorption/desorption member 40, a motor (a driver) 24, a first blower (a cooling blower) 60, a heat exchanger 30, a circulation duct 25, a circulation duct 26, a heater 22, a second blower 23, a cooling duct 21.

Figure 4:
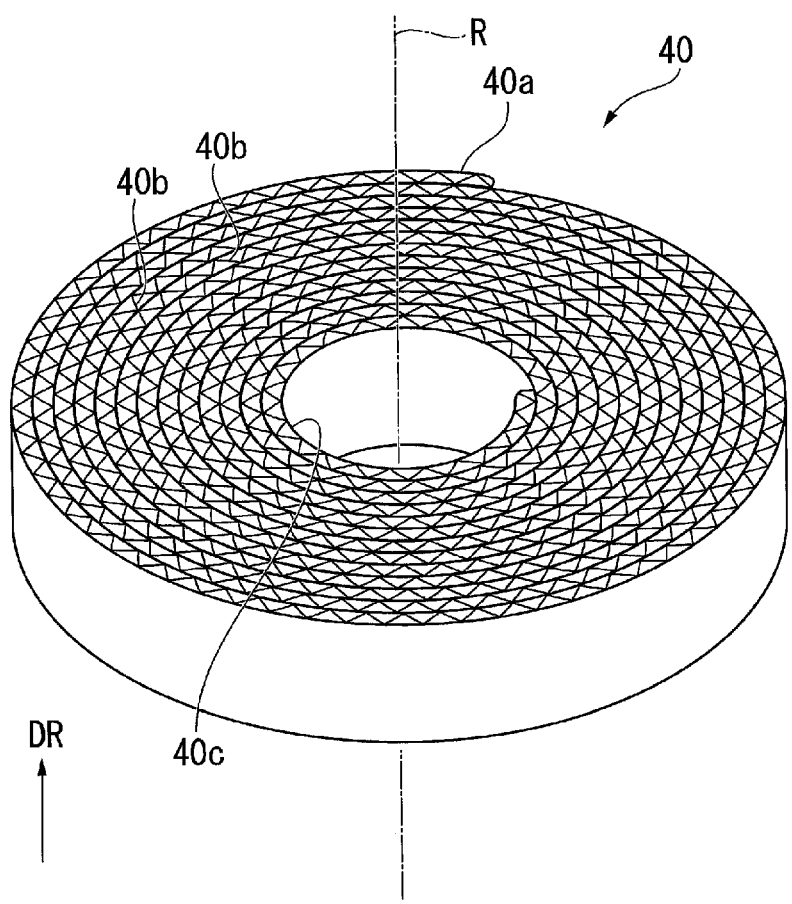
FIG. 4 is a perspective view showing a moisture absorption/desorption member in the first embodiment.

FIG. 4 is a perspective view showing the moisture absorption/desorption member 40. As shown in FIG. 4, the moisture absorption/desorption member 40 has a flat cylindrical shape centered on a rotational axis R. In a central part of the moisture absorption/desorption member 40, there is formed a central hole 40c centered on the rotational axis R. The central hole 40c penetrates the moisture absorption/desorption member 40 in an axial direction of the rotational axis R. The moisture absorption/desorption member 40 rotates around the rotational axis R. In the following description, the axial direction of the rotational axis R is referred to as a "rotational axis direction DR," and is arbitrarily represented by a DR axis in the drawings.

The moisture absorption/desorption member 40 has an infinitely large number of through holes 40b penetrating the moisture absorption/desorption member 40b in the rotational axis direction DR. The moisture absorption/desorption member 40 is a porous member. The moisture absorption/desorption member 40 has a moisture absorption/desorption property. In the present embodiment, the moisture absorption/desorption member 40 is manufactured by, for example, winding a belt-like member 40a shaped like a belt and having the through holes 40b around the rotational axis R, and then coating a surface exposed outside in the belt-like member 40a thus wound with a material having a moisture absorption/desorption property. It should be noted that the surface exposed outside in the belt-like member 40a thus wound includes an outside surface of the moisture absorption/desorption member 40, an inner circumferential surface of the central hole 40c, and internal surfaces of the through holes 40b. It should be noted that the moisture absorption/desorption member 40 can wholly be made of a material provided with the moisture absorption/desorption property. As the material having the moisture absorption/desorption property, there can be cited, for example, zeolite and silica gel.

An output shaft of the motor 24 shown in FIG. 3 is fixed in a state of being inserted into the central hole 40c of the moisture absorption/desorption member 40. The motor 24 rotates the moisture absorption/desorption member 40 around the rotational axis R. The rotational speed of the moisture absorption/desorption member 40 rotated by the motor 24 is, for example, about no lower than 0.2 rpm and no higher than 5 rpm.

The first blower 60 is, for example, an intake fan for taking external air in the projector 1. The first blower 60 feeds air AR1 to apart of the moisture absorption/desorption member 40 located in a first area F1. The first area F1 is an area on one side of the rotational axis R in a direction perpendicular to the rotational axis R. In contrast, in the direction perpendicular to the rotational axis R, an area on the other side of the rotational axis R, namely an area on the opposite side to the first area F1 with respect to the rotational axis R, corresponds to a second area F2. The first area F1 is an area on the upper side of the rotational axis R in FIG. 3. The second area F2 is an area on the lower side of the rotational axis R in FIG. 3.

As shown in FIG. 2, the first blower 60 feeds the air AR1 also to the light modulation units 4R, 4G, and 4B as the cooling target. In other words, in the present embodiment, the first blower 60 is a cooling blower for feeding the air AR1 to the cooling target. The first blower 60 is not particularly limited providing the first blower 60 is capable of feeding the air AR1, and can be, for example, an axial fan or a centrifugal fan.

Figure 5:
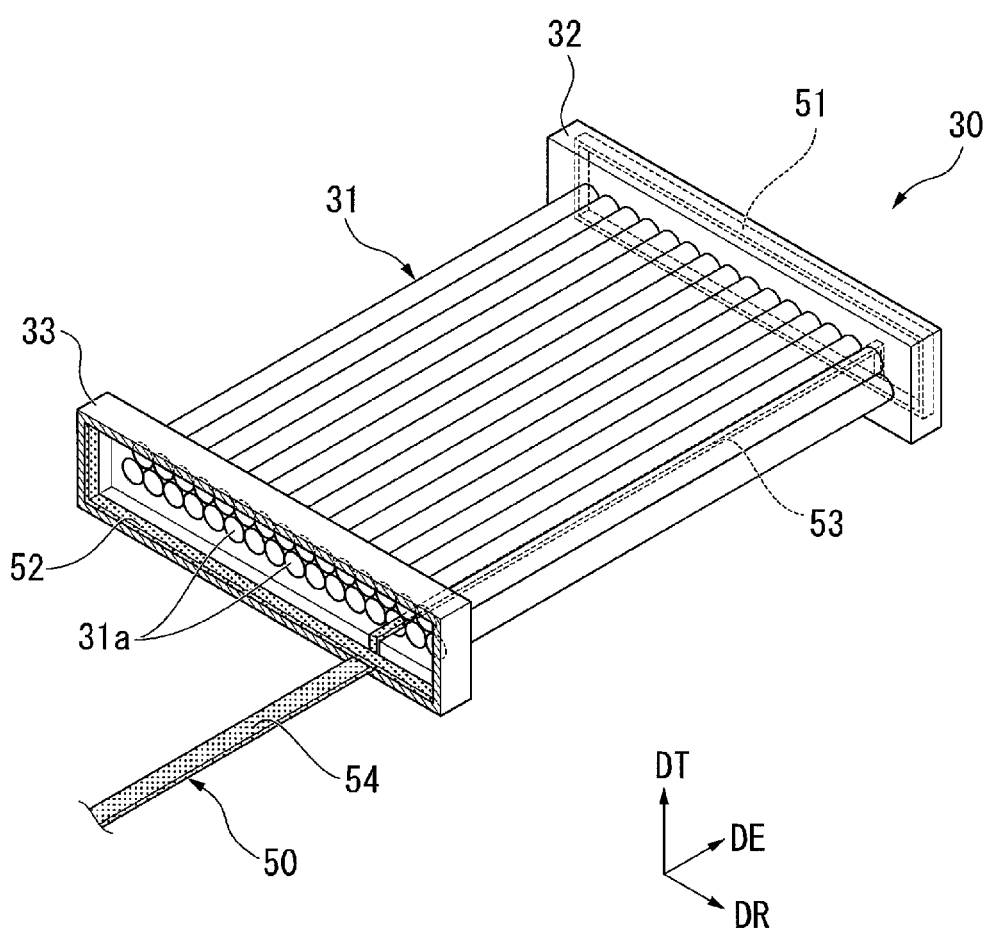
FIG. 5 is a partial cross-sectional perspective view showing a heat exchanger in the first embodiment.

The heat exchanger 30 is a section where the refrigerant W is generated. FIG. 5 is a partial cross-sectional perspective view showing the heat exchanger 30. As shown in FIG. 5, the heat exchanger 30 has a flowing part 31, a first lid part 32, and a second lid part 33.

The flowing part 31 has a plurality of pipe parts 31a each having a tubular shape extending in one direction. In the present embodiment, the one direction in which the pipe parts 31a extend is, for example, perpendicular to the rotational axis direction DR. The pipe parts 31a each open on both sides in the one direction in which the pipe parts 31a extend. A shape of a cross-sectional surface of the pipe part 31a perpendicular to the one direction in which the pipe parts 31a extend is, for example, a circular shape. It should be noted that in the following description, the one direction in which the pipe parts 31a extend is referred to as an "extension direction DE," and is arbitrarily represented by a DE axis in the drawings. The first area F1 and the second area F2 described above are separated in the extension direction DE perpendicular to the rotational axis direction DR with reference to the rotational axis R.

In the present embodiment, the flowing part 31 is formed of a plurality of layers each formed of the plurality of pipe parts 31a arranged along the rotational axis direction DR stacked along a direction perpendicular to both of the rotational axis direction DR and the extension direction DE. It should be noted that in the following description, the direction perpendicular to both of the rotational axis direction DR and the extension direction DE is referred to as a "thickness direction DT," and is arbitrarily represented by a DT axis in the drawings. In the present embodiment, the dimension in the thickness direction of DT the flowing part 31 is smaller than, for example, the dimension in the rotational axis direction DR of the flowing part 31, and is the smallest of the dimensions of the flowing part 31 in the direction perpendicular to the extension direction DE.

The first lid part 32 is coupled to an end part on one side (+DE side) in the extension direction DE in the flowing part 31. The first lid part 32 has a rectangular solid box-like shape elongated in the rotational axis direction DR. Inside the first lid part 32, one ends in the extension direction DE of the pipe parts 31a open. As shown in FIG. 3, inside the first lid part 32, there is disposed a partition part 32a. The partition part 32a separates the inside of the first lid part 32 into a first space S1 and a second space S2 arranged side by side in the rotational axis direction DR. In FIG. 3, the first space S1 is located on the right side (+DR side) of the second space S2.

The first lid part 32 is provided with a communication hole 32b for communicating the first space S1 and the inside of the circulation duct 26 with each other. The first lid part 32 is provided with a communication hole 32c for communicating the second space S2 and the inside of the circulation duct 25 with each other.

The second lid part 33 is coupled to an end part on the other side (−DE side) in the extension direction DE in the flowing part 31, namely an end part on an opposite side to the side where the first lid part 32 is coupled to the flowing part 31. As shown in FIG. 5, the second lid part 33 has a rectangular solid box-like shape elongated in the rotational axis direction DR. Inside the second lid part 33, the other ends in the extension direction DE of the pipe parts 31a open. Unlike the first lid part 32, the inside of the second lid part 33 is not partitioned. The inside of the second lid part 33 is communicated with each of the first space S1 and the second space S2 of the first lid part 32 via the inside of each of the pipe parts 31a of the flowing part 31. The second lid part 33 is coupled to the refrigerant sender 50. Thus, the heat exchanger 30 is coupled to the refrigerant sender 50. It should be noted that in FIG. 5, a wall on the other side in the extension direction DE in the second lid part 33 is omitted.

As shown in FIG. 3, the circulation duct 26 is a duct disposed on one side (+DR side) of the moisture absorption/desorption member 40 in the rotational axis direction DR. The circulation duct 26 has an inflow port opening on the other side (−DR side) in the rotational axis direction DR toward a part of the moisture absorption/desorption member 40 located in the second area F2. The circulation duct 26 has an outflow port to be communicated with the communication hole 32b of the first lid part 32.

The circulation duct 25 is a duct disposed on the other side (−DR side) of the moisture absorption/desorption member 40 in the rotational axis direction DR. The circulation duct 25 has an outflow port opening on the one side (+DR side) in the rotational axis direction DR toward the part of the moisture absorption/desorption member 40 located in the second area F2. The circulation duct 25 has an inflow port to be communicated with the communication hole 32c of the first lid part 32.

The heater 22 has a heating main body part 22a. The heating main body part 22a is disposed inside the circulation duct 25. The heating main body part 22a is disposed on the other side (−DR side) of the part of the moisture absorption/desorption member 40 located in the second area F2 in the rotational axis direction DR. The heating main body part 22a is, for example, an electric heater. The heating main body part 22a heats an inside atmosphere (air) of the circulation duct 25. In the present embodiment, the heater 22 has the second blower 23.

The second blower 23 is disposed inside the circulation duct 26. The second blower 23 is disposed on the one side (+DR side) of the part of the moisture absorption/desorption member 40 located in the second area F2 in the rotational axis direction DR. The second blower 23 is, for example, a centrifugal fan. The air taken from the other side (−DR side) in the rotational axis direction DR is discharged by the second blower 23 toward the other side (−DE side) in the extension direction DE from an exhaust port 23a. The exhaust port 23a opens in the communication hole 32b of the first lid part 32. The second blower 23 feeds the air to the first space S1 via the communication hole 32b.

The air discharged from the second blower 23 to the first space S1 is the air having been taken in from the other side (−DR side) in the rotational axis direction DR of the second blower 23 via the inflow port of the circulation duct 26, and is the air having passed through the part of the moisture absorption/desorption member 40 located in the second area F2. In other words, the second blower 23 makes the air pass through the part of the moisture absorption/desorption member 40 located in the second area F2 different from the first area F1, and then feeds the air to the heat exchanger 30. In the present embodiment, the air which has not passed the part of the moisture absorption/desorption member 40 located in the second area F2 flows inside the circulation duct 25. Therefore, the heating main body part 22a heats the air which has not passed the part of the moisture absorption/desorption member 40 located in the second area F2.

As described above, in the present embodiment, the heater 22 feeds the air which has been heated by the heating main body part 22a to the part of the moisture absorption/desorption member 40 located in the second area F2 by the second blower 23 to thereby heat the part of the moisture absorption/desorption member 40 located in the second area F2. Thus, the second blower 23 feeds the ambient air of the part heated by the heater 22 in the moisture absorption/desorption member 40 to the heat exchanger 30.

The air which has flowed into the heat exchanger 30 from the second blower 23 via the first space S1 passes inside the pipe parts 31a communicated with the first space S1 out of the plurality of pipe parts 31a, and then inflows into the inside of the second lid part 33. The air which has flowed into the inside of the second lid part 33 passes through the inside of the pipe parts 31a communicated with the second space S2 out of the plurality of pipe parts 31a, then inflows into the second space S2, and then inflows into the inside of the circulation duct 25 from the communication hole 32c. The air having flowed into the inside of the circulation duct 25 is heated by the heating main body part 22a, then passes through the part of the moisture absorption/desorption member 40 located in the second area F2 once again, then inflows into the inside of the circulation duct 26, and is then taken in by the second blower 23.

As described hereinabove, in the present embodiment, the refrigerant generator 20 has a circulation channel 27 through which the air discharged from the second blower 23 circulates. The circulation channel 27 is constituted by at least the circulation ducts 25, 26 and the heat exchanger 30. The circulation channel 27 passes the heating main body part 22a, the moisture absorption/desorption member 40, and the heat exchanger 30. Although a narrow gap is provided between the moisture absorption/desorption member 40 and each of the circulation ducts 25, the circulation channel 27 is substantially sealed, and thus, the air from the outside is prevented from inflowing into the inside of the circulation channel 27. It should be noted that in the following description, the air which has been discharged from the second blower 23 and then circulates through the circulation channel 27 is referred to as air AR2.

The cooling duct 21 is a duct having an inflow port disposed on the one side (+DR side) of the part of the moisture absorption/desorption member 40 located in the first area F1 in the rotational axis direction DR. Into the cooling duct 21, there inflows the air AR1 which has been discharged from the first blower 60, and has passed through the part of the moisture absorption/desorption member 40 located in the first area F1. The cooling duct 21 extends from an area on one side of the part of the moisture absorption/desorption member 40 located in the first area F1 toward the heat exchanger 30.

The cooling duct 21 has a cooling passage part 21a extending in the rotational axis direction DR. In the cooling passage part 21a, there is disposed the flowing part 31 of the heat exchanger 30 so as to penetrate in the extension direction DE. Thus, in the inside of the cooling passage part 21a, there is disposed the flowing part 31. The air AR1 passing through the cooling passage part 21a is made to blow against the outside surface of the flowing part 31, and then passes through the flowing part 31 in the rotational axis direction DR. Thus, the flowing part 31 is cooled by the air AR1. In other words, the heat exchanger 30 is cooled by the air AR1 which has been discharged from the first blower 60, and then passed through the moisture absorption/desorption member 40. In FIG. 3, the air AR1 passes through the flowing part 31 from the right side to the left side in the cooling passage part 21a. An end part on the other side (−DR side) in the rotational axis direction DR in the cooling passage part 21a opens. The opening of the cooling passage part 21a is, for example, an outflow port of the cooling duct 21.

When the air AR1 is fed to the part of the moisture absorption/desorption member 40 located in the first area F1 from the first blower 60, the steam included in the air AR1 is absorbed by the part of the moisture absorption/desorption member 40 located in the first area F1. The part of the moisture absorption/desorption member 40 having absorbed the steam as the moisture moves from the first area F1 to the second area F2 by the motor 24 rotating the moisture absorption/desorption member 40. Then, through the part of the moisture absorption/desorption member 40 located in the second area F2, there passes the air AR2 which has been heated by the heating main body part 22a, and is relatively high in temperature. Thus, the moisture having been absorbed by the moisture absorption/desorption member 40 evaporates to be released to the air AR2.

The air AR2 including the steam which has been absorbed from the air AR1 by passing through the moisture absorption/desorption member 40 is fed by the second blower 23 to the heat exchanger 30. The air AR2 having flowed into the heat exchanger 30 from the first space S1 flows through the flowing part 31. More particularly, the air AR2 flows through the pipe parts 31a of the flowing part 31. The flowing part 31 is cooled from the outside by the air AR1 flowing along the rotational axis direction DR through the cooling passage part 21a of the cooling duct 21.

When the flowing part 31 is cooled, the air AR2 which flows through the pipe parts 31a and is relatively high in temperature is cooled, and thus, the steam having been included in the air AR2 is condensed to the water as a fluid, namely the refrigerant W. In such a manner, the heat exchanger 30 is cooled to thereby generate the refrigerant W from the air AR2 having flowed into the heat exchanger 30.

In the present embodiment, the refrigerant sender 50 is formed of a porous member, and transmits the refrigerant W due to a capillary action. As the material of the refrigerant sender 50, there can be cited, for example, polypropylene, cotton, and porous metal. It is preferable for the material of the refrigerant sender 50 to be a material capable of making the surface tension of the refrigerant sender 50 relatively high. As shown in FIG. 5, the refrigerant sender 50 has a first trapping part 51, a second trapping part 52, a third trapping part 53, and a coupling part 54.

The first trapping part 51 is fixed to an edge part on the one side (+DE side) in the extension direction DE in the inside surface of the first lid part 32. The first trapping part 51 is shaped like a thin belt, and is formed along the edge part of the first lid part 32 to have a rectangular frame shape. The second trapping part 52 is fixed to an edge part on the other side (−DE side) in the extension direction DE in the inside surface of the second lid part 33. The second trapping part 52 is shaped like a thin belt, and is formed along the edge part of the second lid part 33 to have a rectangular frame shape.

The third trapping part 53 extends from the first trapping part 51 to the second trapping part 52 through the inside of the pipe part 31a to couple the first trapping part 51 and the second trapping part 52 to each other. The third trapping part 53 is shaped like a thin belt extending in the extension direction DE. In the present embodiment, the third trapping part 53 is disposed inside one of the pipe parts 31a as shown in FIG. 5, but this is not a limitation. The third trapping part 53 can be disposed inside some of the pipe parts 31a, or can also be disposed inside all of the pipe parts 31a. When the third trapping part 53 is disposed inside some of the pipe parts 31a, it is also possible for the third trapping part 53 to be disposed inside two or more of the pipe parts 31a.

Figure 6:
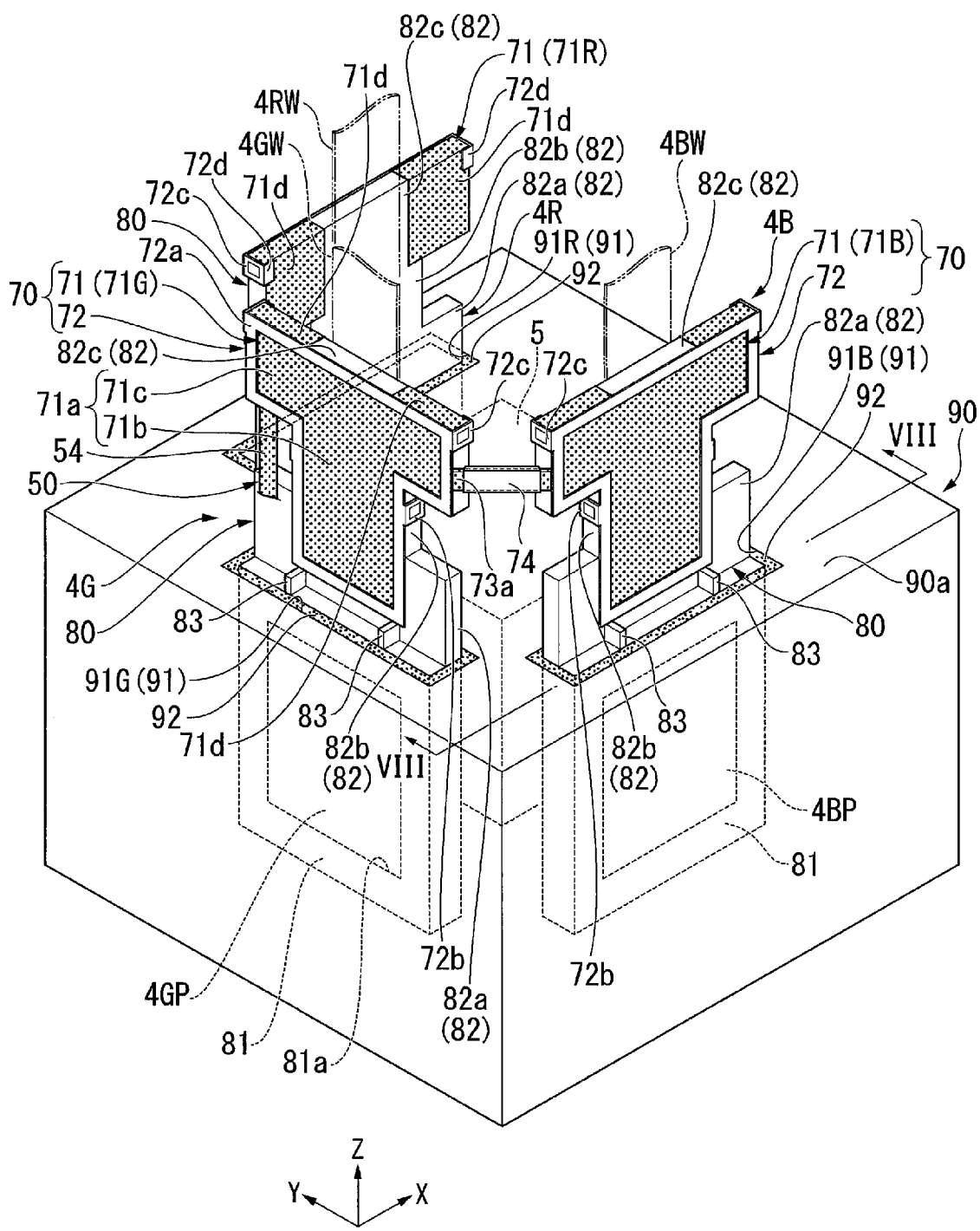
FIG. 6 is a perspective view showing light modulation units, a light combining optical system, and a dust-proof case in the first embodiment.

The coupling part 54 is a part for coupling the refrigerant generator 20 and the cooling target to each other. In the present embodiment, the coupling part 54 is coupled to the second trapping part 52, and projects from the inside of the second lid part 33 to the outside of the second lid part 33 so as to penetrate the wall of the second lid part 33. As shown in FIG. 6, the coupling part 54 projecting to the outside of the second lid part 33 extends to the light modulation unit 4G as the cooling target. FIG. 6 is a perspective view showing the light modulation units 4R, 4G, and 4B, the light combining optical system 5, and a dust-proof case 90 described later. The coupling part 54 is shaped like a thin belt. The width of the coupling part 54 is larger than, for example, the width of the first trapping part 51, the width of the second trapping part 52, and the width of the third trapping part 53.

Then, the light modulation units 4R, 4G, and 4B as the cooling target in the present embodiment will be described in more detail. In the following description, an up-and-down direction Z defining a positive side as an upper side and a negative side as a lower side is arbitrarily represented by a Z axis in the drawings. A direction parallel to an optical axis AX of a projection lens the closest to the light exit side in the projection optical device 6, namely a direction parallel to the projection direction of the projection optical device 6, is referred to as an "optical axis direction X," and is arbitrarily represented by an X axis in the drawings. The optical direction X is perpendicular to the up-and-down direction Z. Further, a direction perpendicular to both of the optical axis direction X and the up-and-down direction Z is referred to as a "width direction Y," and is arbitrarily represented by a Y axis in the drawings.

It should be noted that the up-and-down direction Z, the upper side, and the lower side are mere names for explaining the relative positional relationship between the constituents, and the actual arrangement relationship and so on can also be other arrangement relationships and so on than the arrangement relationships and so on represented by these names. Further, in the present embodiment, there is described when the up-and-down direction Z is a vertical direction.

As shown in FIG. 6, the light modulation unit 4R, the light modulation unit 4G, and the light modulation unit 4B as the cooling target are disposed so as to surround the light combining optical system 5. The light modulation unit 4R and the light modulation unit 4B are disposed across the light combining optical system 5 from each other in the width direction Y. The light modulation unit 4R and the light modulation unit 4B are disposed so as to be symmetric with respect to the width direction Y to each other. The light modulation unit 4G is disposed on the light incident side (−X side) in the optical axis direction X of the light combining optical system 5. The posture of the light modulation unit 4G is a posture obtained by rotating the light modulation unit 4R counterclockwise as much as 90° viewed from the upper side.

In the light modulation unit 4R, the direction of the light passing through the light modulator 4RP is parallel to the width direction Y. In the light modulation unit 4R, a positive side (+Y side) in the width direction Y is the light incident side on which the light enters the light modulator 4RP, and a negative side (−Y side) in the width direction Y is the light exit side on which the light is emitted from the light modulator 4RP.

In the light modulation unit 4G, the direction of the light passing through the light modulator 4GP is parallel to the optical axis direction X. In the light modulation unit 4G, a negative side (−X side) in the optical axis direction X is the light incident side on which the light enters the light modulator 4GP, and a positive side (+X side) in the optical axis direction X is the light exit side on which the light is emitted from the light modulator 4GP.

In the light modulation unit 4B, the direction of the light passing through the light modulator 4BP is parallel to the width direction Y. In the light modulation unit 4B, a negative side (−Y side) in the width direction Y is the light incident side on which the light enters the light modulator 4BP, and a positive side (+Y side) in the width direction Y is the light exit side on which the light is emitted from the light modulator 4BP.

The light modulation units 4R, 4G, and 4B and cooling promoters 70 described later and respectively provided to the light modulation units 4R, 4G, and 4B have substantially the same shapes although different from each other in the arrangement position and the posture. Therefore, in the following description, only the light modulation unit 4G and the cooling promoter 70 provided to the light modulation unit 4G are described as the representative in some cases unless otherwise noted.

The light modulation units 4R, 4G, and 4B have holding frames 80 for holding the light modulators 4RP, 4GP, and 4BP, respectively. The holding frames 80 of the light modulation units 4R, 4G, and 4B are different in arrangement and posture from each other so as to correspond to the arrangements and the postures of the light modulation units 4R, 4G, and 4B, but have substantially the same shapes as each other.

The holding frame 80 provided to the light modulation unit 4G has a shape flat in the optical axis direction X in which the light passes through the light modulator 4GP, and elongated in the up-and-down direction Z. The holding frame 80 has a frame main body part 81, an extending part (a cooling target part) 82, and support parts 83. The frame main body part 81 is a part for holding the light modulator 4GP. The frame main body part 81 has a rectangular frame shape having a through hole 81a penetrating the frame main body part 81 in the optical axis direction X. In the through hole 81a, there is fitted the light modulator 4GP. Thus, the light modulator 4GP is held by the holding frame 80 with the outer peripheral edge part held by the frame main body part 81.

The extending part 82 is a part extending from the frame main body part 81. In the present embodiment, the extending part 82 extends upward from a region located on the light exit side (+X side) out of an upper end part of the frame main body part 81. The extending part 82 is disposed on the upper side (+Z side) in the vertical direction (the Z-axis direction) of the light modulator 4GP. The dimension in the optical axis direction X of the extending part 82 is smaller than the dimension in the optical axis direction X of the frame main body part 81. In the present embodiment, the extending part 82 is the cooling target part to which the refrigerant W is transmitted from the refrigerant sender 50. In other words, the light modulation units 4R, 4G, and 4B corresponding to the cooling target in the present embodiment include the light modulators 4RP, 4GP, and 4BP corresponding to the cooling target main body part, and the extending parts 82 corresponding to the cooling target parts, respectively.

The extending part 82 is thermally coupled to the light modulator 4GP as the cooling target main body part via the frame main body part 81. It should be noted that in the present specification, the sentence "certain objects are thermally coupled to each other" is sufficiently satisfied when the certain objects are coupled to each other in a state in which the heat transfer is achievable between the certain objects. In other words, the heat of the light modulator 4GP can be transferred to the extending part 82 via the frame main body part 81.

The extending part 82 includes a first part 82a, a second part 82b, and a third part 82c. The first part 82a, the second part 82b, and the third part 82c are contiguous with one another in this order from the lower side toward the upper side. The first part 82a, the second part 82b, and the third part 82c each have a rectangular solid shape elongated in the width direction Y perpendicular to both of the up-and-down direction Z and the optical axis direction X in which the light passes through the light modulator 4GP.

The dimension in the width direction Y of the first part 82a is the same as the dimension in the width direction Y of the frame main body part 81. The dimension in the width direction Y of the second part 82b is smaller than the dimension in the width direction Y of the first part 82a. The dimension in the width direction Y of the third part 82c is larger than the dimension in the width direction Y of the first part 82a and the dimension in the width direction Y of the second part 82b. The third part 82c projects on both sides in the width direction Y from the second part 82b.

The support parts 83 project from the first part 82a of the extending part 82 toward the light incident side (−X side). The support parts 83 are disposed as a pair at an interval in the width direction Y. An end part on the lower side of each of the support parts 83 is connected to a surface on the upper side of the frame main body part 81. The support parts 83 support a refrigerant holder 71 described later and a fixation member 72 from the lower side.

In the present embodiment, the holding frames 80 are each made of metal. The material of the holding frames 80 includes, for example, aluminum. In the present embodiment, the thermal conductivity of the holding frames 80 is higher than the thermal conductivity of the refrigerant sender 50. The thermal conductivity of the holding frames 80 is, for example, equal to or higher than 80 [W/(m·K)]. It should be noted that the material of the holding frames 80 is not particularly limited, and can also include other metal such as copper.

In the present embodiment, the projector 1 is further provided with the cooling promoters 70 respectively provided to the light modulation units 4R, 4G, and 4B as the cooling target. The cooling promoters 70 each have the refrigerant holder 71 and the fixation member 72. The refrigerant holder 71 is formed of a porous member for retaining the refrigerant W. As the material of the refrigerant holder 71, there can be cited, for example, polypropylene, cotton, and porous metal. The material of the refrigerant holder 71 can be made the same as the material of, for example, the refrigerant sender 50. It is preferable for the material of the refrigerant holder 71 to be a material capable of making the surface tension of the refrigerant holder 71 relatively high.

Figure 7:
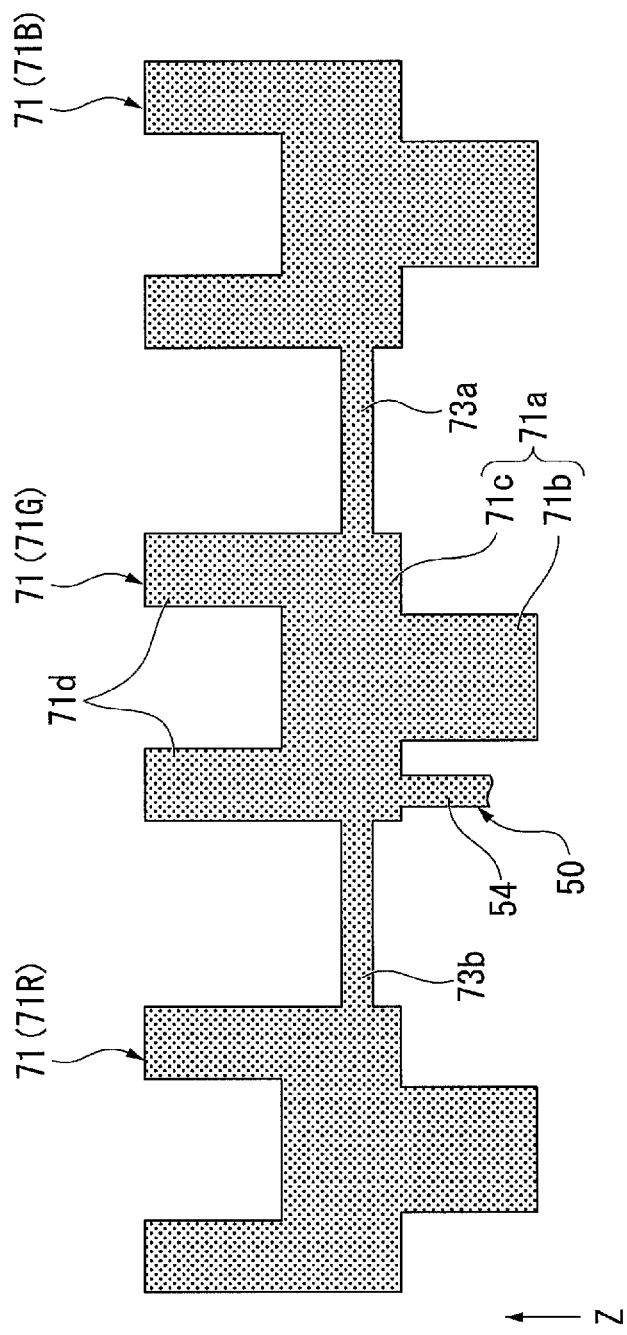
FIG. 7 is a diagram showing a refrigerant holder in the first embodiment.

The refrigerant holder 71 is disposed on a surface of the extending part 82 as the cooling target part. In the present embodiment, the refrigerant holder 71 is disposed so as to straddle the surfaces on the both sides of the extending part 82 in the direction in which the light passes through each of the light modulators 4RP, 4GP, and 4BP. FIG. 7 is a diagram showing the refrigerant holder 71. As shown in FIG. 7, the refrigerant holder 71R provided to the light modulation unit 4R, the refrigerant holder 71G provided to the light modulation unit 4G, and the refrigerant holder 71B provided to the light modulation unit 4B are the same in shape as each other. The shape of the refrigerant holder 71G will hereinafter be described as a representative.

The refrigerant holder 71G has a main body part 71a and a pair of folded parts 71d. As shown in FIG. 6, the main body part 71a is disposed on a surface on the light incident side (−X side) of the extending part 82. The main body part 71a has a narrow part 71b and a wide part 71c.

In the present embodiment, the narrow part 71b has a rectangular shape. The narrow part 71b is disposed so as to straddle the surface on the light incident side (−X side) of the first part 82a and the surface on the light incident side of the second part 82b out of the extending part 82. The narrow part 71b covers a central part in the width direction Y out of the surface on the light incident side of the first part 82a, and the entire surface on the light incident side of the second part 82b.

In the present embodiment, the wide part 71c has a rectangular shape. The wide part 71c is contiguous with an upper side of the narrow part 71*b*. The wide part 71*c* projects on both sides in the width direction Y from the narrow part 71*b*. The wide part 71*c* is disposed on a surface on the light incident side (−X side) of the third part 82*c* out of the extending part 82. The wide part 71*c* covers the entire surface on the light incident side of the third part 82*c*.

The pair of folded parts 71*d* are respectively disposed in both end parts in the width direction Y in the upper end part of the wide part 71*c*. The pair of folded parts 71*d* are folded back on the light incident side (+X side) passing through the upper side of the extending part 82. The pair of folded parts 71*d* are each disposed so as to straddle the surface on the upper side of the third part 82*c* and the surface on the light incident side of the third part 82*c* out of the extending part 82. The pair of folded parts 71*d* each cover the both end parts in the width direction Y out of the surface on the upper side of the third part 82*c*, and the both end parts in the width direction Y out of the surface on the light incident side of the third part 82*c*.

As shown in FIG. 7, the refrigerant holder 71G provided to the light modulation unit 4G out of the refrigerant holders 71 provided to the light modulation units 4R, 4G, and 4B is coupled to the refrigerant sender 50. More particularly, the coupling part 54 of the refrigerant sender 50 is coupled to a lower end part of the wide part 71*c* out of the refrigerant holder 71G. In contrast, in the refrigerant holder 71B attached to the light modulation unit 4B and the refrigerant holder 71R attached to the light modulation unit 4R, the coupling part 54 is not coupled.

In the present embodiment, on both sides of the refrigerant holder 71G attached to the light modulation unit 4G, there are disposed the junction parts 73*a*, 73*b* to which the refrigerant holder 71B attached to the light modulation unit 4B and the refrigerant holder 71R attached to the light modulation unit 4R are respectively joined. The junction parts 73*a*, 73*b* are each made of a porous member.

The junction part 73*a* joins the refrigerant holder 71G attached to the light modulation unit 4G and the refrigerant holder 71B attached to the light modulation unit 4B to each other. More particularly, the junction part 73*a* joins the wide part 71*c* of the refrigerant holder 71G and the wide part 71*c* of the refrigerant holder 71B to each other. Thus, the refrigerant holder 71B is coupled to the coupling part 54 of the refrigerant sender 50 via the refrigerant holder 71G. As shown in FIG. 6, the junction part 73*a* is provided with a cover part 74 for covering the junction part 73*a*. The cover part 74 is, for example, a film made of resin.

As shown in FIG. 7, the junction part 73*b* joins the refrigerant holder 71G attached to the light modulation unit 4G and the refrigerant holder 71R attached to the light modulation unit 4R to each other. More particularly, the junction part 73*b* joins the wide part 71*c* of the refrigerant holder 71G and the wide part 71*c* of the refrigerant holder 71R to each other. Thus, the refrigerant holder 71R is coupled to the coupling part 54 of the refrigerant sender 50 via the refrigerant holder 71G. Although not shown in the drawings, the junction part 73*b* is also provided with the cover part 74 similarly to the junction part 73*a*.

As shown in FIG. 6, the fixation member 72 is a member for fixing the refrigerant holder 71. Since the fixation members 72 respectively provided to the light modulation units 4R, 4G, and 4B have substantially the same shapes, in the following description, the fixation member 72 for fixing the refrigerant holder 71G provided to the light modulation unit 4G will be described as a representative.

The fixation member 72 is a plate-like member. The fixation member 72 is made of, for example, metal. The fixation member 72 has a frame part 72*a* and attachment parts 72*b*, 72*c*. The frame part 72*a* is located on the light incident side (−X side) of the main body part 71*a* in the refrigerant holder 71. The frame part 72*a* covers the outer edge part of the main body part 71*a*. An outer shape of the frame part 72*a* is substantially the same as an outer shape of the main body part 71*a*.

The extending part 82, the main body part 71*a* of the refrigerant holder 71, and the frame part 72*a* are stacked on one another in the direction (the optical axis direction X) of the light passing through the light modulation unit 4G. In the following description, the direction in which the extending part 82, the main body part 71*a* of the refrigerant holder 71, and the frame part 72*a* are stacked on one another is simply referred to as a "stacking direction." The fixation member 72 fixes the main body part 71*a* of the refrigerant holder 71 by sandwiching the main body part 71*a* of the refrigerant holder 71 between the frame part 72*a* and the extending part 82 as the cooling target part in the stacking direction (the optical axis direction X).

In the present embodiment, at least a part of the refrigerant holder 71 is exposed when viewed from the fixation member 72 side (the light incident side) in the stacking direction. More particularly, a part located on the inner side of the frame part 72*a* out of the main body part 71*a* of the refrigerant holder 71 is exposed when viewed from the fixation member 72 side in the stacking direction.

The attachment parts 72*b* are respectively disposed on both end parts in the width direction Y in a lower portion of the frame part 72*a*. The attachment parts 72*c* are respectively disposed on both end parts in the width direction Y in an upper portion of the frame part 72*a*. The attachment parts 72*b*, 72*c* each project from the frame part 72*a* toward the light incident side (+X side). The attachment parts 72*b* are respectively engaged with protrusions disposed on the side surfaces of the second part 82*b* out of the holding frame 80. The attachment parts 72*c* are respectively engaged with protrusions disposed on the side surfaces of the third part 82*c* out of the holding frame 80. Thus, the fixation member 72 is fixed to the holding frame 80. A tip part of each of the attachment parts 72*c* is a click part 72*d* which is bent to press the pair of folded parts 71*d* from the light exit side. It should be noted that in FIG. 6, there are shown the click parts 72*d* of the fixation member 72 provided to the light modulation unit 4R.

The light modulation unit 4R has an interconnection 4RW electrically coupled to the light modulator 4RP. The light modulation unit 4G has an interconnection 4GW electrically coupled to the light modulator 4GP. The light modulation unit 4B has an interconnection 4BW electrically coupled to the light modulator 4BP. The interconnections 4RW, 4GW, and 4BW each extend in the up-and-down direction Z on the light exit side of the extending part 82, and are drawn on the upper side of the extending part 82. The interconnections 4RW, 4GW, and 4BW are each disposed so as to be opposed to an area between the portions provided with the pair of folded parts 71*d* out of the surface on the light exit side of the extending part 82 in each of the holding frames 80.

Figure 8:
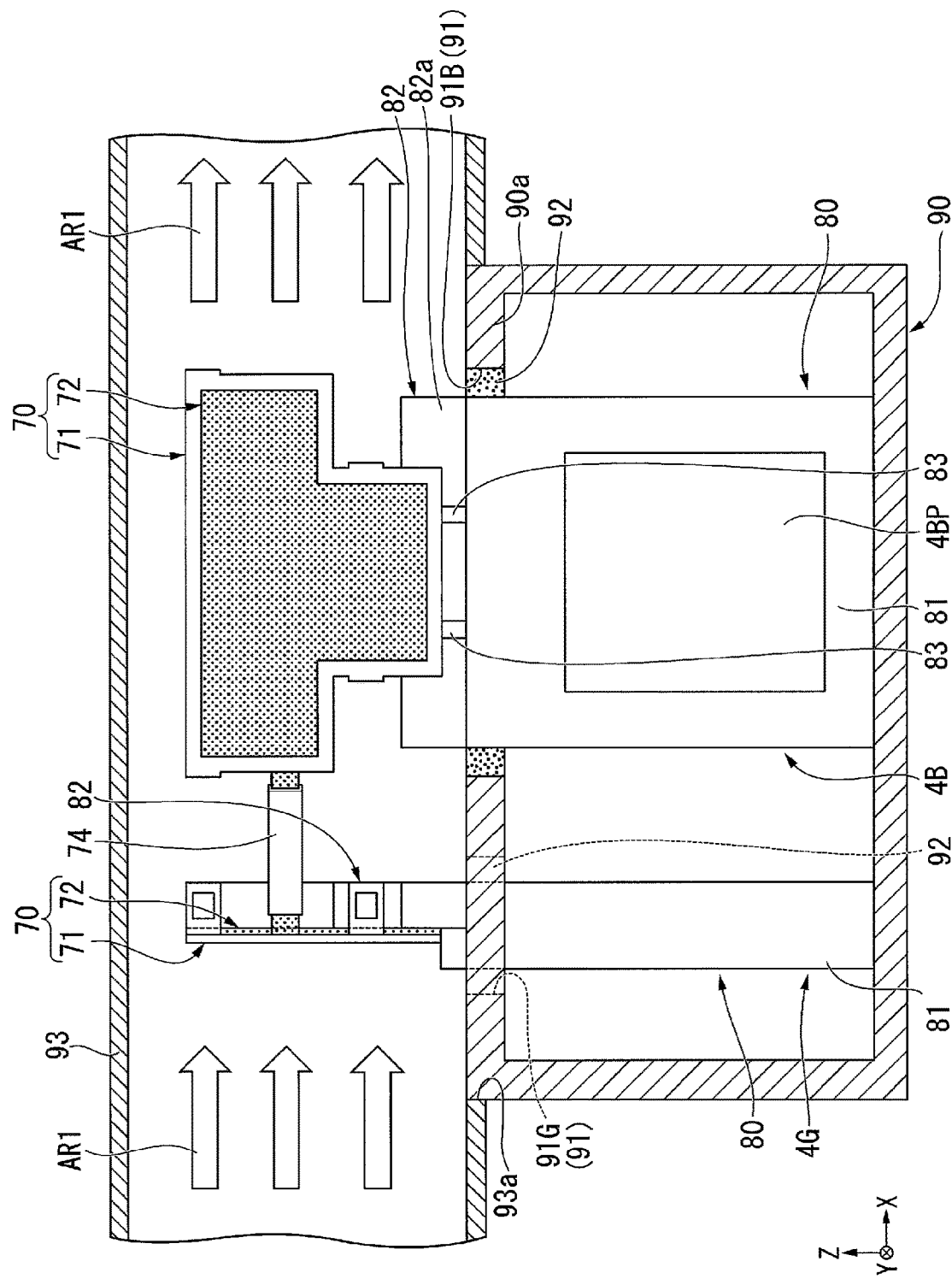
FIG. 8 is a cross-sectional view showing the light modulation units, the dust-proof case, and a circulation duct in the first embodiment, and is a VIII-VIII cross-sectional view in FIG. 6.

As shown in FIG. 8, the projector 1 is further provided with the dust-proof case 90 for housing at least a part of the cooling target inside, and a circulation duct 93 through which the air AR1 fed from the first blower (the cooling blower) 60 flows. FIG. 8 is a cross-sectional view showing the light modulation units 4B, 4G, the dust-proof case 90, and a circulation duct 93 in the present embodiment, and is a VIII-VIII cross-sectional view in FIG. 6.

As shown in FIG. 6 and FIG. 8, the dust-proof case 90 is shaped like, for example, a rectangular solid box. The dust-proof case 90 has a dust-proof property. The dust-proof case 90 is closed, and is made capable of blocking passage of grit and dust between the inside and the outside of the dust-proof case 90.

It should be noted that in the present specification, the expression of "a certain object has a dust-proof property" includes that the certain object has a property of preventing grit and dust from passing, or a property of substantially preventing grit and dust from passing. The property of substantially preventing grit and dust from passing includes a property capable of blocking 90% or more of the grit and dust which are urged to pass the certain object.

As shown in FIG. 6, in the present embodiment, the dust-proof case 90 houses the light combining optical system 5, the light modulators 4RP, 4GP, and 4BP, and the frame main body part 81 for holding the light modulators 4RP, 4GP, and 4BP inside. In other words, the light modulators 4RP, 4GP, and 4BP as the cooling target main body part are disposed inside the dust-proof case 90.

The dust-proof case 90 is provided with through holes 91 through which the holding frames 80 pass. In the present embodiment, the through holes 91 are disposed in a top wall part 90a located on the upper side out of the wall parts constituting the dust-proof case 90 having a rectangular solid shape. The through holes 91 each penetrate the top wall part 90a in the up-and-down direction Z. The through holes 91 are each, for example, a hole having a rectangular shape. In the present embodiment, there is provided a plurality of the through holes 91. As the through holes 91, for example, there are disposed three through holes 91R, 91G, and 91B.

The holding frames 80 of the light modulation units 4R, 4G, and 4B are inserted through the three through holes 91R, 91G, and 91B, respectively. The extending parts 82 provided to the light modulation units 4R, 4G, and 4B project on the upper side of the dust-proof case 90 via the through holes 91R, 91G, and 91B, respectively. Thus, the extending parts 82 as the cooling target part are disposed outside the dust-proof case 90. As shown in FIG. 8, inside each of the through holes 91, there is inserted an end part on the upper side of the frame main body part 81 out of the holding frame 80.

In the present embodiment, between the through hole 91 and the holding frame 80, there is disposed a sealing member 92. The sealing member 92 seals a gap between an inner side surface of the through hole 91 and an outer side surface of the holding frame 80. In the present embodiment, the sealing member 92 seals the gap between the inner side surface of the through hole 91 and an outer side surface in an upper end part of the frame main body part 81. It is preferable to use a relatively soft material as the material of the sealing member 92. This is because it is possible to make it difficult to apply a stress to the holding frame 80 inserted through the through hole 91. The sealing member 92 can be, for example, a sponge-like member or a gelled member.

In the present embodiment, the circulation duct 93 is disposed on the upper side of the dust-proof case 90, and extends in the optical axis direction X. The wall part on the lower side of the circulation duct 93 is provided with a hole part 93a. In the hole part 93a, there is fitted the top wall part 90a of the dust-proof case 90. Inside the circulation duct 93, there are disposed the extending parts 82 in the plurality of light modulation units 4R, 4G, and 4B, and the cooling promotion parts 70 provided to the respective extending parts 82. In the present embodiment, inside the circulation duct 93, the air AR1 from the first blower 60 flows from the light incident side (−X side) in the optical axis direction X of the light combining optical system 5 toward the light exit side (+X side). The air AR1 flowing inside the circulation duct 93 is made to blow against the plurality of extending parts 82 and the plurality of cooling promotion parts 70. Thus, the first blower 60 feeds the air AR1 to the extending parts 82 as the cooling target part.

The refrigerant W generated by the refrigerant generator 20 is transmitted to the refrigerant holder 71G using the coupling part 54 of the refrigerant sender 50. The refrigerant W transmitted to the refrigerant holder 71G is transmitted to the refrigerant holder 71B via the junction part 73a, and at the same time, transmitted to the refrigerant holder 71R via the junction part 73b. In such a manner, the refrigerant W generated in the refrigerant generator 20 is transmitted to the three light modulation units 4R, 4G, and 4B. Then, the refrigerant W transmitted to and then retained in the refrigerant holder 71 is evaporated, and thus, the light modulation units 4R, 4G, and 4B as the cooling target are cooled. More particularly, by the refrigerant W retained in the refrigerant holders 71 evaporating, the extending parts 82 as the cooling target part are cooled, and thus, the frame main body part 81 and the light modulators 4RP, 4GP, and 4BP thermally coupled to the extending parts via the frame main body parts 81 are cooled. Thus, it is possible to cool the light modulation units 4R, 4G, and 4B as the cooling target due to the cooler 10.

According to the present embodiment, it is possible for the cooler 10 to cool the cooling target by drawing heat from the cooling target using the evaporation of the refrigerant W as an endothermic reaction after transmitting the refrigerant W generated in the refrigerant generator 20 to the cooling target with the refrigerant sender 50. The cooling action by the evaporation of the refrigerant W can actively draw heat from the cooling target, and is therefore superior in cooling performance compared to when cooling the cooling target by mere heat transmission to the refrigerant as in the case of air cooling or liquid cooling. Thus, when obtaining the same cooling performance as those of air cooling and liquid cooling, it is easy to reduce the entire size of the cooler 10 compared to air cooling and liquid cooling.

Further, in the case of the cooling action by the evaporation of the refrigerant W, the cooling performance can be improved by increasing the surface area where the refrigerant W to be evaporated has contact with the cooling target. Therefore, even when raising the cooling performance obtained using the cooler 10, it is possible to suppress an increase in the sound noise. As described above, according to the present embodiment, it is possible to obtain the projector 1 equipped with the cooler 10 excellent in cooling performance, small in size, and excellent in quietness.

Further, according to the present embodiment, since the refrigerant W can be generated in the refrigerant generator 20, time and effort for refilling the refrigerant W are not required for the user, and thus, the convenience of the user can be enhanced. Further, since it is possible for the refrigerant generator 20 to control generation of the refrigerant W so as to generate necessary amount of refrigerant W when needed, it is not necessary to retain the refrigerant W in a reservoir tank or the like, and thus, it is possible to reduce the weight of the projector 1.

Further, according to the present embodiment, it is possible to absorb the steam included in the air AR1 fed from the first blower 60 by the moisture absorption/desorption member 40, and it is possible to release the moisture absorbed by the moisture absorption/desorption member 40 in the air AR2 fed by the second blower 23 as steam. Further, it is possible to generate the refrigerant W by condensing the moisture released as steam in the air AR2 using the heat exchanger 30. Thus, according to the present embodiment, it is possible to generate the refrigerant W from the air in the projector 1.

Further, according to the present embodiment, the heat exchanger 30 is cooled by the air AR1 which has been discharged from the first blower 60, and then passed through the moisture absorption/desorption member 40. Therefore, it is unnecessary to separately dispose a cooling section for cooling the heat exchanger 30, and thus, it is possible to suppress an increase in the number of components of the projector 1. Further, it is possible to prevent the sound noise generated from the projector 1 from increasing compared to when additionally provide a blower as the cooling section for cooling the heat exchanger 30.

Further, when the refrigerant W having transmitted to the cooling target evaporates, the humidity of the ambient air becomes relatively high due to the refrigerant W having evaporated. Therefore, there is a possibility that the air relatively high in humidity affects the cooling target to cause a problem. Specifically, when the cooling target is an optical element, there is a possibility that the propagation of the light entering the optical element or the light emitted from the optical element is hindered by the refrigerant W evaporated in the cooling target. Thus, there is a possibility that the reliability of the projector degrades.

In contrast, according to the present embodiment, the extending parts 82 as the cooling target part are disposed outside the dust-proof case 90. Therefore, the refrigerant W transmitted to the extending parts 82 evaporates outside the dust-proof case 90. On the other hand, the light modulators 4RP, 4GP, and 4BP as the cooling target main body part are disposed inside the dust-proof case 90. Therefore, it is possible for the dust-proof case 90 to prevent the refrigerant W evaporated outside the dust-proof case 90 from moving to the periphery of the light modulators 4RP, 4GP, and 4BP. Thus, it is possible to prevent the ambient air of the light modulators 4RP, 4GP, and 4BP from becoming high in humidity due to the refrigerant W having evaporated. Therefore, it is possible to prevent the propagation of the light entering the light modulators 4RP, 4GP, and 4BP and the light emitted from the light modulators 4RP, 4GP, and 4BP from being hindered. As described above, according to the present embodiment, it is possible to prevent the refrigerant W having evaporated from causing the problem in the cooling target main body part, and thus, it is possible to enhance the reliability of the projector 1.

In particular, according to the present embodiment, the light modulation units 4R, 4G, and 4B are each the cooling target, and the light modulators 4RP, 4GP, and 4BP are each the cooling target main body part. Therefore, it is possible to prevent the problem from occurring in the light modulators 4RP, 4GP, and 4BP, thus it is possible to prevent the problem that a fluctuation occurs in the color image (picture) emitted from the projector 1.

Further, according to the present embodiment, the dust-proof case 90 is provided with the through holes 91 through which the holding frames 80 are inserted, and the sealing member 92 is disposed between the through hole 91 and the holding frame 80. Therefore, it is possible to prevent the foreign matter and the refrigerant W having evaporated from entering the dust-proof case 90 from the gap between the through hole 91 and the holding frame 80. Thus, the reliability of the projector 1 can further be enhanced.

Further, according to the present embodiment, the cooler 10 includes the first blower 60 as the cooling blower for feeding the air to the cooling target part. Therefore, it is easy to evaporate the refrigerant W transmitted to the extending parts 82 as the cooling target part with the air AR1 fed from the first blower 60, and thus, it is possible to further cool the light modulation units 4R, 4G, and 4B. Further, since the first blower 60 for feeding the air AR1 to the moisture absorption/desorption member 40 can be used as the cooling blower, there is no need to separately dispose the cooling blower in addition to the first blower 60. Thus, it is possible to prevent the number of components of the projector 1 from increasing, and thus, it is possible to prevent the sound noise from increasing.

Further, as described above, in the present embodiment, the evaporation of the refrigerant W fed to the cooling target part is promoted using the first blower 60 as the intake fan for taking in the external air inside the projector 1. Therefore, even when lowering the output of the first blower 60, it is possible to obtain the cooling performance equivalent to when the cooler 10 according to the present embodiment is not provided, and the cooling target is cooled only by feeding air. Therefore, it is possible to lower the output of the first blower 60 as the intake fan to thereby reduce the sound noise generated from the first blower 60, and thus, it is possible to further enhance the quietness of the projector 1.

Further, according to the present embodiment, the respective extending parts 82 in the plurality of light modulation units 4R, 4G, and 4B are disposed inside the circulation duct 93 through which the air AR1 fed from the first blower 60 flows. Therefore, the air AR1 fed from the first blower 60 can be fed to the plurality of extending parts 82 in good condition. Thus, it is possible to promote the evaporation of the refrigerant W in each of the extending parts 82 in good condition, and thus, it is possible to further cool the light modulation units 4R, 4G, and 4B as the cooling target.

Further, according to the present embodiment, the holding frames 80 for holding the light modulators 4RP, 4GP, and 4BP as the cooling target main body part are each made of metal. Therefore, the heat of the light modulators 4RP, 4GP, and 4BP is easily transferred to the holding frames 80. Thus, by cooling the extending parts 82 as the cooling target part out of the holding frames 80 using the evaporation of the refrigerant W, it is possible to cool the light modulators 4RP, 4GP, and 4BP as the cooling target main body part in better condition.

Further, according to the present embodiment, the material of the holding frames 80 includes aluminum. Therefore, it is easy to make the thermal conductivity of the holding frames 80 relatively high. Thus, the heat of the light modulators 4RP, 4GP, and 4BP is more easily transferred to the holding frames 80. Therefore, by cooling the extending parts 82 as the cooling target part out of the holding frames 80 using the evaporation of the refrigerant W, it is possible to cool the light modulators 4RP, 4GP, and 4BP as the cooling target main body part in better condition.

Further, according to the present embodiment, the thermal conductivity of the holding frames 80 is higher than the thermal conductivity of the refrigerant sender 50. Therefore, it is easy to make the thermal conductivity of the holding frames 80 relatively high. Thus, the heat of the light modulators 4RP, 4GP, and 4BP is more easily transferred to the holding frames 80. Therefore, by cooling the extending parts 82 as the cooling target part out of the holding frames 80 using the evaporation of the refrigerant W, it is possible to cool the light modulators 4RP, 4GP, and 4BP as the cooling target main body part in better condition.

Further, according to the present embodiment, the extending parts 82 as the cooling target part are provided with the refrigerant holders 71 for retaining the refrigerant W. Therefore, it is possible to retain the refrigerant W having been transmitted to the extending parts 82 to the extending parts 82 with the refrigerant holders 71 until the refrigerant W evaporates. Thus, it is easy to use the refrigerant W thus generated without a waste, and it is possible to further improve the cooling performance of the cooler 10.

Further, according to the present embodiment, the refrigerant holders 71 are respectively attached to the surfaces of the extending parts 82 as the cooling target part, and are made of the porous material. Further, at least a part of each of the refrigerant holders 71 is exposed when viewed from the refrigerant holder 71 side in the stacking direction. Therefore, it is easy to evaporate the refrigerant W from the exposed part of the refrigerant holder 71, and it is possible to further improve the cooling performance of the cooler 10. Further, since the refrigerant holders 71 are each made of the porous material, it is easy to make the refrigerant W evenly take over the surface of the cooling target part on which the refrigerant holder 71 is disposed due to the capillary action, and it is easier to cool the cooling target.

Further, for example, when fixing the refrigerant holders 71 to the extending parts 82 with an adhesive, the adhesive is absorbed by the refrigerant holders 71 to block the holes of the refrigerant holders 71 made of the porous material in some cases. Therefore, it becomes difficult for the refrigerant W to be absorbed by the refrigerant holders 71, and it becomes difficult for the refrigerant holders 71 to retain the refrigerant W in some cases.

In contrast, according to the present embodiment, there are provided the fixation members 72 each for sandwiching the refrigerant holder 71 with the extending parts 82 to fix the refrigerant holder 71. Therefore, it is possible to fix the refrigerant holders 71 to the respective extending parts 82 without using the adhesive. Thus, it is possible to prevent the refrigerant holders 71 from becoming difficult to retain the refrigerant W. Further, in the present embodiment, the fixation members 72 are made of metal. Therefore, the fixation members 72 are relatively high in thermal conductivity, and are easy to cool. Therefore, it is easy for the temperature of the fixation members 72 to drop due to the air AR1 from the first blower 60 and the evaporation of the refrigerant W, and thus, it is easier to cool the cooling target part having contact with the fixation members 72.

Further according to the present embodiment, the refrigerant holders 71 are provided to the respective light modulation units 4R, 4G, and 4B thus disposed as the plurality of units, and there are provided the junction parts 73a, 73b for joining the refrigerant holders 71 to each other. Therefore, by coupling the refrigerant sender 50 to one of the refrigerant holders 71, it is possible to transmit the refrigerant W also to the rest of the refrigerant holders 71. Thus, it is possible to simplify the arrangement of the refrigerant sender 50 inside the projector 1.

Further, according to the present embodiment, the junction parts 73a, 73b are provided with the covering parts 74 for respectively covering the junction parts 73a, 73b. Therefore, it is possible to prevent the refrigerant W moving along the junction parts 73a, 73b from evaporating in the junction parts 73a, 73b. Thus, it is possible to prevent the refrigerant W from evaporating without making a contribution to cooling of the light modulation units 4R, 4G, and 4B as the cooling target, and thus, it is possible to prevent the refrigerant W thus generated from being wasted.

It should be noted that in the present embodiment, the coupling part 54 can be coated similarly to the junction parts 73a, 73b. According to this configuration, it is possible to prevent the refrigerant W from evaporating during the transmission to the cooling target. Therefore, it is possible to efficiently transmit the refrigerant W to the cooling target, and at the same time, it is possible to more strictly prevent the refrigerant W thus generated from being wasted. It is also possible for the coupling part 54 and the junction parts 73a, 73b to be coated in the periphery with, for example, a tube. Further, it is also possible for the coupling part 54 and the junction parts 73a, 73b to be provided with a coating treatment for preventing the evaporation on the respective surfaces.

Further, for example, in the refrigerant generator 20, when the humidity of the air AR2 fed from the second blower 23 to the heat exchanger 30 is relatively low, the refrigerant W is difficult to be generated in some cases even when the heat exchanger 30 is cooled. The humidity of the air AR2 to be fed to the heat exchanger 30 drops in some cases when, for example, the air outside the projector 1 is mixed with the air AR2.

In this regard, according to the present embodiment, the refrigerant generator 20 has the circulation channel 27 through which the air AR2 discharged from the second blower 23 circulates. Therefore, it is possible to prevent the air located outside the projector 1 from entering the circulation channel 27 by substantially sealing the circulation channel 27, and it is easy to keep the humidity of the air AR2 fed to the heat exchanger 30 in a relatively high state. Therefore, by cooling the heat exchanger 30, it is possible to generate the refrigerant W in good condition.

Further, according to the present embodiment, the heater 22 has the heating main body part 22a for heating the air which has not passed the part of the moisture absorption/desorption member 40 located in the second area F2, and the second blower 23. Therefore, it is possible for the heater 22 to heat the part of the moisture absorption/desorption member 40 located in the second area F2 by feeding the air AR2 to the moisture absorption/desorption member 40 using the second blower 23. Thus, it is possible to heat the moisture absorption/desorption member 40 using the heater 22 even when disposing the heating main body part 22a at a position distant from the moisture absorption/desorption member 40. Therefore, the degree of freedom of the configuration of the heater 22 can be enhanced.

Further, according to the present embodiment, the refrigerant generator 20 has the motor 24 for rotating the moisture absorption/desorption member 40. Therefore, it is possible to stably rotate the moisture absorption/desorption member 40 at a constant speed. Thus, it is possible to make the part of the moisture absorption/desorption member 40 located in the first area F1 preferably absorb the steam from the air AR1, and at the same time, it is possible to make the part of the moisture absorption/desorption member 40 located in the second area F2 preferably release the moisture to the air AR2. Therefore, it is possible to efficiently generate the refrigerant W.

Further, according to the present embodiment, the refrigerant sender 50 transmits the refrigerant W due to a capillary action. Therefore, there is no need to separately prepare a power source such as a pump for transmitting the refrigerant W. Thus, it is possible to prevent the number of components of the projector 1 from increasing, and thus, it is easier to reduce the size and the weight of the projector 1.

Further, according to the present embodiment, the refrigerant sender 50 has the coupling part 54 made of the porous material for coupling the refrigerant generator 20 and the cooling target to each other. Therefore, it is possible to make the coupling part 54 absorb the refrigerant W to transmit the refrigerant W with the capillary action.

Further, according to the present embodiment, the refrigerant sender 50 has the second trapping part 52 disposed inside the second lid part 33. The second trapping part 52 is coupled to the coupling part 54. Therefore, it is possible to absorb the refrigerant W retained inside the second lid part 33 using the second trapping part 52 to transmit the refrigerant W to the coupling part 54 using the capillary action. Thus, it is easy to transmit the refrigerant W thus generated to the cooling target without a waste.

Further, according to the present embodiment, the refrigerant sender 50 has the first trapping part 51 disposed inside the first lid part 32, and a third trapping part 53 for coupling the first trapping part 51 and the second trapping part 52 to each other. Thus, it is possible to absorb the refrigerant W retained inside the first lid part 32 using the first trapping part 51 to transmit the refrigerant W to the second trapping part 52 via the third trapping part 53 using the capillary action. Therefore, it is possible to transmit the refrigerant W retained inside the first lid part 32 from the second trapping part 52 to the coupling part 54 to transmit the refrigerant W to the cooling target. Therefore, it is easy to transmit the refrigerant W thus generated to the cooling target with a fewer waste.

Further, according to the present embodiment, the third trapping part 53 passes through the pipe part 31a. Therefore, it is possible to absorb the refrigerant W retained inside the pipe part 31a using the third trapping part 53 to transmit the refrigerant W to the cooling target via the second trapping part 52 and the coupling part 54. Therefore, it is easy to transmit the refrigerant W thus generated to the cooling target with a fewer waste.

Further, according to the present embodiment, the width of the coupling part 54 is larger than, for example, the width of the first trapping part 51, the width of the second trapping part 52, and the width of the third trapping part 53. Therefore, it is easy to make the width of the coupling section 54 relatively large, and it is possible to increase the amount of the refrigerant W which can be transmitted by the coupling part 54. Therefore, it is easy to transmit the refrigerant W to the cooling target using the refrigerant sender 50, and it is easier to cool the cooling target.

Further, on the other hand, it is easy to make the width of the first trapping part 51, the width of the second trapping part 52, and the width of the third trapping part 53 relatively small. Therefore, it is possible to reduce the amount of the refrigerant W to be retained by the first trapping part 51, the second trapping part 52, and the third trapping part 53. Thus, it is possible to reduce the amount of the refrigerant W remaining inside the heat exchanger 30 while being retained in the first trapping part 51, the second trapping part 52, and the third trapping part 53, and it is easy to transmit the refrigerant W thus generated to the cooling target with a fewer waste.

Second Embodiment

Figure 9:
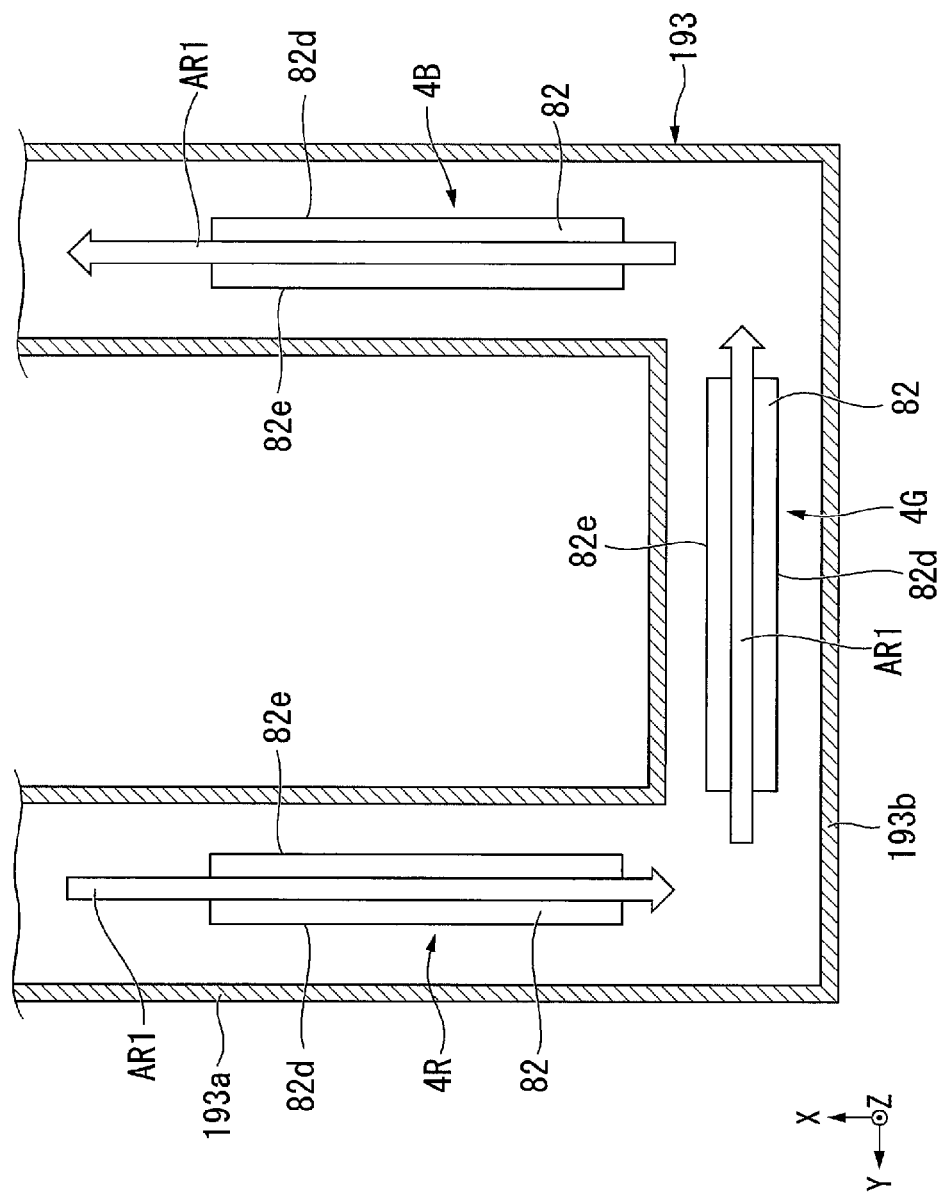
FIG. 9 is a cross-sectional view of light modulation units and a circulation duct in a second embodiment viewed from an upper side.

The present embodiment is different in shape of the circulation duct 193 from the first embodiment. The rest of the configuration in the present embodiment is substantially the same as the rest of the configuration in the first embodiment. FIG. 9 is a cross-sectional view of the light modulation units 4R, 4G, and 4B and the circulation duct 193 viewed from the upper side. It should be noted that the constituents substantially the same as those of the embodiment described above are arbitrarily denoted by the same reference symbols, and the description thereof will be omitted in some cases.

As shown in FIG. 9, the circulation duct 193 extends so as to form an angulated U-shape when viewed from the upper side. The circulation duct 193 includes a first circulation part 193a, a second circulation part 193b, and a third circulation part 193c. The first circulation part 193a and the third circulation part 193c extend in the optical axis direction X, and are arranged at a distance in the width direction Y. The second circulation part 193b extends in the width direction Y to join an end part of the first circulation part 193a and an end part of the third circulation part 193c to each other.

Inside the first circulation part 193a, there is disposed the extending part 82 of the light modulation unit 4R. Inside the second circulation part 193b, there is disposed the extending part 82 of the light modulation unit 4G. Inside the third circulation part 193c, there is disposed the extending part 82 of the light modulation unit 4B.

Evaporation surfaces 82d, 82e provided with the refrigerant holder 71 out of the extending part 82 of the light modulation unit 4R are disposed along the optical axis direction X in which the first circulation part 193a extends. Evaporation surfaces 82d, 82e provided with the refrigerant holder 71 out of the extending part 82 of the light modulation unit 4G are disposed along the width direction Y in which the second circulation part 193b extends. Evaporation surfaces 82d, 82e provided with the refrigerant holder 71 out of the extending part 82 of the light modulation unit 4B are disposed along the optical axis direction X in which the third circulation part 193c extends. In each of the extending parts 82, the evaporation surface 82d is a surface facing to the light incident side in the direction of the light passing through each of the light modulation units 4R, 4G, and 4B. In each of the extending parts 82, the evaporation surface 82e is a surface facing to the light exit side in the direction of the light passing through each of the light modulation units 4R, 4G, and 4B.

In the inside of the circulation duct 193, the air AR1 flows inside the first circulation part 193a, inside the second circulation part 193b, and inside the circulation part 193c in this order. In other words, the extending parts 82 of the respective light modulation units 4R, 4G, and 4B are arranged along the flow direction of the air AR1 flowing inside the circulation duct 193. The air AR1 flowing inside the circulation duct 193 is fed to the extending part 82 of the light modulation unit 4R, the extending part 82 of the light modulation unit 4G, and the extending part 82 of the light modulation unit 4B in this order.

As described above, according to the present embodiment, it is possible to feed the air AR1 from the first blower 60 in sequence to the plurality of extending parts 82. Therefore, it is easy to feed the air AR1 in good condition to each of the extending parts 82. Specifically, for example, by disposing the evaporation surfaces 82d, 82e disposed on the respective sides opposite to each other along the direction in which the circulation duct 193 extends, it is possible to make it easy to make the air AR1 have contact with both of the evaporation surface 82d and the evaporation surface 82e. Thus, it is possible to make it easy to feed the air AR1 to the refrigerant holder 71 disposed on the evaporation surfaces 82d, 82e of the extending part 82, and thus, it is possible to efficiently evaporate the refrigerant W having been transmitted to the refrigerant holder 71. Therefore, it is possible to promote the evaporation of the refrigerant W in each of the extending parts 82 in good condition, and thus, it is easier to cool the light modulation units 4R, 4G, and 4B as the cooling target.

Third Embodiment

Figure 10:
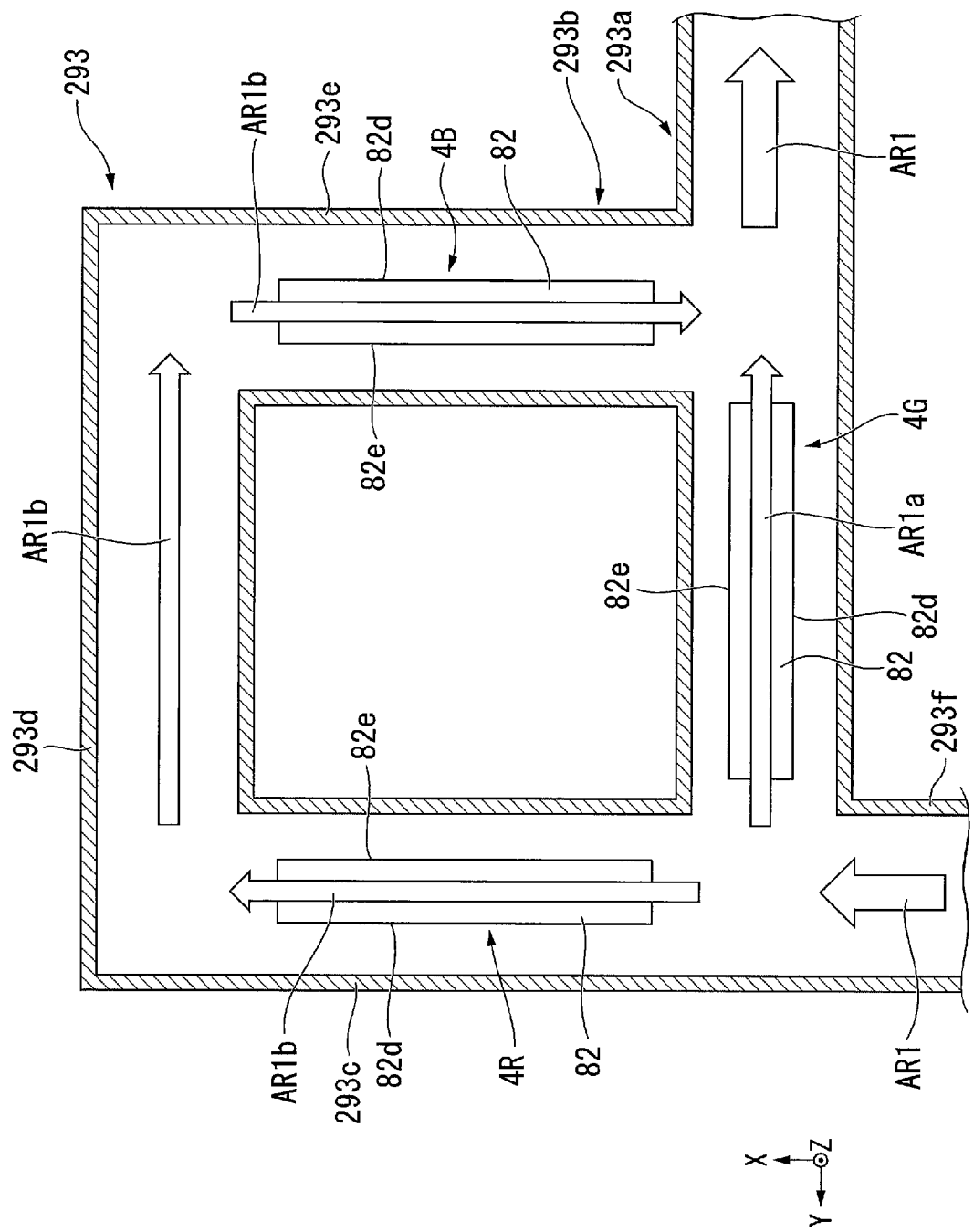
FIG. 10 is a cross-sectional view of light modulation units and a circulation duct in a third embodiment viewed from an upper side.

The present embodiment is different in shape of the circulation duct 293 from the first embodiment. The rest of the configuration in the present embodiment is substantially the same as the rest of the configuration in the first embodiment. FIG. 10 is a cross-sectional view of the light modulation units 4R, 4G, and 4B and the circulation duct 293 viewed from the upper side. It should be noted that the constituents substantially the same as those of the embodiment described above are arbitrarily denoted by the same reference symbols, and the description thereof will be omitted in some cases.

As shown in FIG. 10, the circulation duct 293 includes an inflow part 293f, a first circulation part (a branch path) 293a, and a second circulation part (a branch path). The inflow part 293f is a portion where the air AR1 from the first blower 60 inflows. The inflow part 293f extends in the optical axis direction X. In the inflow part 293f, the air AR1 inflows from the other side (−X side) in the optical axis direction X toward the one side (+X side).

The first circulation part 293a and the second circulation part 293b correspond to a plurality of branch paths to which the air AR1 fed from the first blower 60 via the inflow part 293f branches. The first circulation part 293a extends from the inflow part 293f toward the other side (−Y side) in the width direction. The second circulation part 293b extends from the inflow part 293f toward the one side (+X side) in the optical axis direction X, and is then folded back to form an angulated U-shape to join the first circulation part 293a. The second circulation part 293b includes an upstream part 293c, a midstream part 293d, and a downstream part 293e.

The upstream part 293c and the downstream part 293e extend in the optical axis direction X, and are arranged at a distance in the width direction Y. The midstream part 293d extends in the width direction Y to join an end part on the one side (+X side) in the optical axis direction of the upstream part 293c and an end part on the one side in the optical axis direction of the downstream part 293e to each other. An end part on the other side (−X side) in the optical axis direction of the downstream part 293e joins the first circulation part 293a.

The air AR1 having flowed inside the circulation duct 293 from the inflow part 293f branches into air AR1a inflowing into the first circulation part 293a, and air AR1b inflowing into the second circulation part 293b. The air AR1b inflowing into the second circulation part 293b flows through the upstream part 293c, the midstream part 293d, and the downstream part 293e in this order, and then joins the air AR1a flowing inside the first circulation part 293a.

Inside the first circulation part 293a, there is disposed the extending part 82 of the light modulation unit 4G. Inside the second circulation part 293b, there are disposed the extending part 82 of the light modulation unit 4R and the extending part 82 of the light modulation unit 4B. In other words, in each of the first circulation part 293a and the second circulation part 293b as the plurality of branch paths, there is disposed at least one extending part 82. In the present embodiment, the extending part 82 of the light modulation unit 4R is disposed inside the upstream part 293c out of the second circulation part 293b. The extending part 82 of the light modulation unit 4B is disposed inside the downstream part 293e out of the second circulation part 293b. The extending parts 82 of the respective light modulation units 4R, 4g, and 4B are disposed so that the evaporation surfaces 82d, 82e are arranged along the direction in which the each part of the circulation duct 293 extends similarly to the second embodiment.

The air AR1a inflowing into the first circulation part 293a is fed to the extending part 82 of the light modulation unit 4G. The air AR1b inflowing into the second circulation part 293b is fed to the extending part 82 of the light modulation unit 4R and the extending part 82 of the light modulation unit 4B in this order.

According to the present embodiment, the circulation duct 293 has the first circulation part 293a and the second circulation part 293b as the plurality of branch paths, and at least one extending part 82 is disposed in each of the circulation parts. Therefore, it is possible to make the air AR1a, AR1b which has not passed through the cooling target part inflow into the respective flowing parts as the branch paths. Thus, it is easy to feed the air AR1 relatively low in temperature to the plurality of cooling target pairs, and thus, it is easier to cool the cooling target.

Specifically, in the present embodiment, the air AR1a inflowing into the first circulation part 293a is fed to the extending part 82 of the light modulation unit 4G without passing other extending parts 82. Further, the air AR1b inflowing into the second circulation part 293b is fed to the extending part 82 of the light modulation unit 4R without passing other extending parts 82. Therefore, it is possible to feed the air AR1 which has not passed other extending parts 82 and is therefore relatively low in temperature to the extending part 82 of the light modulation unit 4G and the extending part 82 of the light modulation unit 4R.

Further, the air AR1a flowing inside the first circulation part 293a is fed only to the extending part 82 of the light modulation unit 4G out of the plurality of extending parts 82. Here, the light modulation unit 4G is apt to be higher in amount of heat generation than the other light modulation units 4R, 4B. Therefore, the air AR1a which has passed the extending part 82 of the light modulation unit 4G is apt to become relatively high in temperature. Therefore, by adopting the configuration in which the air AR1a passing the extending part 82 of the light modulation unit 4G is not fed to the other extending parts 82, the extending parts 82 of the plurality of light modulation units 4R, 4G, and 4B can efficiently be cooled.

Fourth Embodiment

Figure 11:
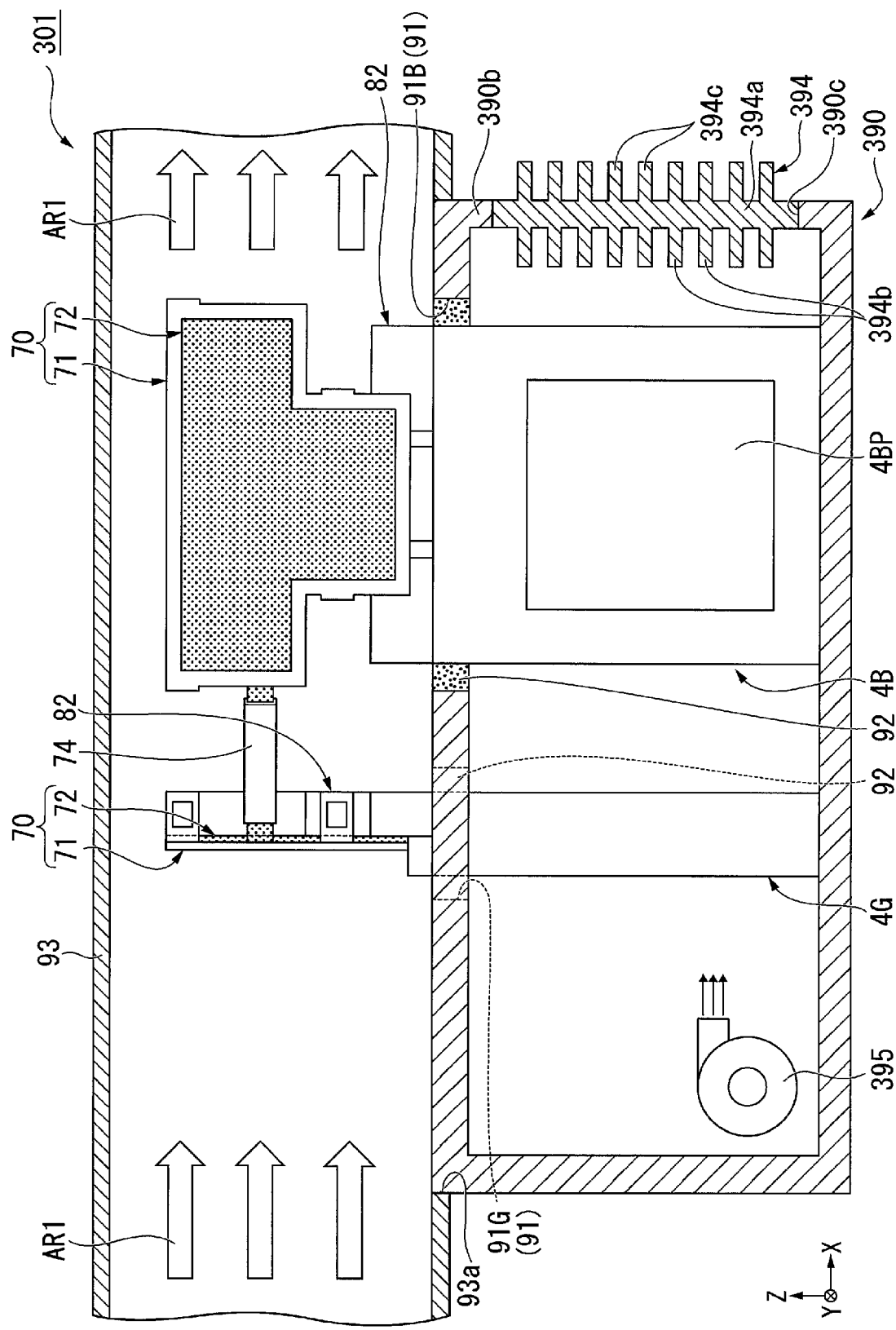
FIG. 11 is a cross-sectional view showing light modulation units, a dust-proof case, and a circulation duct in a fourth embodiment.

The present embodiment is different in the point that a circulation blower 395 is disposed from the first embodiment. FIG. 11 is a cross-sectional view showing the light modulation units 4B, 4G, the dust-proof case 390, and the circulation duct 93. It should be noted that the constituents substantially the same as those of the embodiment described above are arbitrarily denoted by the same reference symbols, and the description thereof will be omitted in some cases.

The projector 301 according to the present embodiment is provided with a circulation blower 395 housed inside the dust-proof case 390. The circulation blower 395 circulates the air inside the dust-proof case 390. In the present embodiment, the direction in which the circulation blower 395 discharges the air is the same direction as the direction in which the air AR1 flows inside the circulation duct 93. The circulation blower 395 is, for example, a centrifugal fan. It should be noted that the circulation blower 395 can also be an axial fan.

The dust-proof case 390 has a heatsink (a heat dissipation structure) 394. The heatsink 394 is a heat dissipation structure for releasing the heat outside the dust-proof case 390. In the present embodiment, the heatsink 394 is disposed in a sidewall part 390b located on one side (+X side) in the optical axis direction out of the wall parts of the dust-proof case 390. In the present embodiment, the heatsink 394 has a base part 394a, a plurality of inner fins 394b, and a plurality of outer fins 394b.

The base part 394a is fitted in a hole part 390c provided to the sidewall part 390b to constitute a part of the sidewall part 390b. The inner side surface of the base part 394a constitutes a part of the inner side surface of the dust-proof case 390. The outer side surface of the base part 394a constitutes a part of the outer side surface of the dust-proof case 390. The plurality of inner fins 394b is disposed on the inner side surface of the base part 394a, namely the inner side surface of the dust-proof case 390. The plurality of inner fins 394b projects to the inside of the dust-proof case 390 from the base part 394a. The plurality of outer fins 394c is disposed on the outer side surface of the base part 394a, namely the outer side surface of the dust-proof case 390. The plurality of outer fins 394c projects to the outside of the dust-proof case 390 from the base part 394a.

The rest of the configuration of the dust-proof case 390 is substantially the same as the rest of the configuration of the dust-proof case 90 in the first embodiment. The rest of the configuration of the projector 301 is substantially the same as the rest of the configuration of the projector 1 according to the first embodiment.

According to the present embodiment, the circulation blower 395 is disposed inside the dust-proof case 390. Therefore, it is possible to circulate the air inside the duct-proof case 390 using the circulation blower 395. Thus, it is easy to transfer the heat of the light modulators 4RP, 4GP, and 4BP housed inside the dust-proof case 390 to the wall part of the dust-proof case 390 via the air circulating. Therefore, it is possible to make it easy to release the heat of the light modulators 4RP, 4GP, and 4BP to the outside from the wall part of the dust-proof case 390. Therefore, it is possible to cool the light modulation units 4R, 4G, and 4B as the cooling target.

Further, according to the present embodiment, the dust-proof case 390 has the heatsink 394 as the heat dissipation structure for releasing heat outside the dust-proof case 390. Therefore, it is possible to make it easy to release the heat transferred to the wall part of the dust-proof case 390 from the light modulators 4RP, 4GP, and 4BP via the air located inside the dust-proof case 390 using the heatsink 394. Thus, it is possible to release the heat of the light modulators 4RP, 4GP, and 4BP to the outside of the dust-proof case 390 in better condition. Therefore, it is possible to cool the light modulation units 4R, 4G, and 4B as the cooling target in better condition.

Further, according to the present embodiment, the heatsink 394 has the plurality of inner fins 394b disposed on the inner side surface of the dust-proof case 390. Therefore, it is easy to absorb the heat of the light modulators 4RP, 4GP, and 4BP from the air located inside the dust-proof case 390 via the plurality of inner fins 394b. Thus, it is possible to make it easier to release the heat of the light modulators 4RP, 4GP, and 4BP to the outside of the dust-proof case 390.

Further, according to the present embodiment, the heatsink 394 has the plurality of outer fins 394c disposed on the outer side surface of the dust-proof case 390. Therefore, it is easy to release the heat of the light modulators 4RP, 4GP, and 4BP transferred to the heatsink 394 via the air located inside the dust-proof case 390 to the air located outside the dust-proof case 390 via the plurality of outer fins 394c. Thus, it is possible to make it easier to release the heat of the light modulators 4RP, 4GP, and 4BP to the outside of the dust-proof case 390.

It should be noted that in the present embodiment, it is also possible to adopt the configurations and methods described below.

In the embodiments described above, it is assumed that the cooling target is the light modulation units, but this is not a limitation. The cooling target is not particularly limited providing the cooling target includes the cooling target main body part and the cooling target part. It is possible to include at least one of the light modulator, the light modulation units, the light source device, a wavelength conversion element for converting the wavelength of the light emitted from the light source device, a diffusion element for diffusing the light emitted from the light source device, and a polarization conversion element for converting the polarization direction of the light emitted from the light source device. According to this configuration, it is possible to cool each of the constituents of the projector in a similar manner as described above.

The shape of the cooling target part is not particularly limited. The shape of the dust-proof case is not particularly limited. The shape of the circulation duct is not particularly limited providing the circulation duct can feed the air from the cooling blower to the cooling target part disposed inside the circulation duct. It is not required to dispose the cooling target part inside the circulation duct. In this case, it is also possible for the circulation duct to be, for example, a duct which extends to the front of the cooling target part to feed the air from the cooling blower toward the cooling target part. It is possible to provide a plurality of the circulation ducts. The circulation duct can be eliminated.

In the embodiments described above, it is assumed that the cooling blower is the first blower 60 provided to the refrigerant generator 20, but this is not a limitation. The refrigerant blower can also be separately provided in addition to the blowers provided to the refrigerant generator 20. The cooling blower can be eliminated.

The heater is not limited to the embodiments described above. The heater can have a configuration of having contact with the moisture absorption/desorption member to heat the moisture absorption/desorption member. In this case, the heater is not required to heat the air which has not passed through the moisture absorption/desorption member.

Further, although in the embodiments described above, there is described the example when the present disclosure is applied to the transmissive projector, the present disclosure can also be applied to reflective projectors. Here, "transmissive" denotes that the light modulator including the liquid crystal panel and so on is a type of transmitting the light. Further, "reflective" denotes that the light modulator is a type of reflecting the light. It should be noted that the light modulator is not limited to the liquid crystal panel or the like, but can also be a light modulator using, for example, micro-mirrors.

Further, although in the embodiments described above, there is cited the example of the projector using the three light modulators, the present disclosure can also be applied to a projector using one light modulator alone or a projector using four or more light modulators.

Further, the configurations described in the present specification can arbitrarily be combined with each other within a range in which the configurations do not conflict with each other.

What is claimed is:

1. A projector having a cooling target, comprising:
a light source configured to emit light;
a light modulator configured to modulate the light emitted from the light source in accordance with an image signal;
a projection optical device configured to project the light modulated by the light modulator;
a cooler configured to cool the cooling target based on transformation of a refrigerant into a gas; and
a dust-proof case configured to house at least a part of the cooling target inside, wherein
the cooler includes
a refrigerant generator configured to generate the refrigerant, and
a refrigerant sender configured to transmit the generated refrigerant toward the cooling target,
the cooling target includes
a cooling target main body part, and
a cooling target part which is thermally coupled to the cooling target main body part, and to which the refrigerant is transmitted from the refrigerant sender,
the cooling target main body part is disposed inside the dust-proof case, and
the cooling target part is disposed outside the dust-proof case.

2. The projector according to claim 1, further comprising:
a light modulation unit including the light modulator and a holding frame configured to hold the light modulator, wherein
the holding frame includes a frame main body part configured to hold the light modulator, and an extending part extending from the frame main body part,
the light modulation unit corresponds to the cooling target,
the light modulator corresponds to the cooling target main body part, and
the extending part corresponds to the cooling target part.

3. The projector according to claim 2, wherein
the dust-proof case has a through hole through which the holding frame is inserted, and
a sealing member is disposed between the through hole and the holding frame.

4. The projector according to claim 1, wherein
the cooler includes a cooling blower configured to deliver air to the cooling target part.

5. The projector according to claim 4, further comprising:
a duct through which the air delivered from the cooling blower flows; and
a plurality of cooling targets including the cooling target, wherein
the respective cooling target parts in the plurality of cooling targets are disposed inside the duct.

6. The projector according to claim 5, wherein
the respective cooling target parts in the plurality of cooling targets are arranged along a flow direction of the air flowing inside the duct.

7. The projector according to claim 5, wherein
the duct includes a plurality of branch paths to which the air delivered from the cooling blower branches, and
at least one of the cooling target parts is disposed in each of the branch paths.

8. The projector according to claim 1, further comprising:
a circulation blower disposed inside the dust-proof case and configured to circulate the air inside the dust-proof case.

9. The projector according to claim 1, wherein
the dust-proof case has a heat dissipation structure configured to release heat outside the dust-proof case.

10. The projector according to claim 9, wherein
the heat dissipation structure includes a plurality of inner fins disposed on an inner side surface of the dust-proof case.

11. The projector according to claim 9, wherein
the heat dissipation structure includes a plurality of outer fins disposed on an outer side surface of the dust-proof case.

* * * * *